United States Patent
Rocha-Alvarez et al.

(10) Patent No.: US 8,203,126 B2
(45) Date of Patent: *Jun. 19, 2012

(54) APPARATUS AND METHOD FOR EXPOSING A SUBSTRATE TO A ROTATING IRRADIANCE PATTERN OF UV RADIATION

(75) Inventors: Juan Carlos Rocha-Alvarez, San Carlos, CA (US); Thomas Nowak, Cupertino, CA (US); Dale R. Du Bois, Los Gatos, CA (US); Sanjeev Baluja, Sunnyvale, CA (US); Scott A. Hendrickson, Brentwood, CA (US); Dustin W. Ho, Fremont, CA (US); Andrzei Kaszuba, San Jose, CA (US); Tom K. Cho, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 90 days.

This patent is subject to a terminal disclaimer.

(21) Appl. No.: 12/841,935

(22) Filed: Jul. 22, 2010

(65) Prior Publication Data

US 2010/0285240 A1 Nov. 11, 2010

Related U.S. Application Data

(60) Division of application No. 11/686,881, filed on Mar. 15, 2007, now Pat. No. 7,777,198, which is a continuation-in-part of application No. 11/124,908, filed on May 9, 2005, now abandoned.

(60) Provisional application No. 60/783,421, filed on Mar. 17, 2006, provisional application No. 60/816,660, filed on Jun. 26, 2006, provisional application No. 60/816,723, filed on Jun. 26, 2006, provisional application No. 60/886,906, filed on Jan. 26, 2007.

(51) Int. Cl.
*G01N 21/00* (2006.01)
*G01N 21/33* (2006.01)
*B01J 19/08* (2006.01)
*B29C 35/08* (2006.01)

(52) U.S. Cl. ............... 250/504 R; 250/365; 250/492.1; 250/492.2; 250/493.1

(58) Field of Classification Search ............. 250/504 R, 250/365, 492.1, 492.2, 493.1
See application file for complete search history.

(56) References Cited

U.S. PATENT DOCUMENTS 3,983,039 A 9/1976 Eastland
(Continued)

FOREIGN PATENT DOCUMENTS

DE 102 41 330 A1 9/2003
(Continued)

OTHER PUBLICATIONS

Nordson Corporation, "CoolWave® 306 System," dated Dec. 2005, 2 pages, UVL-05-3127.

(Continued)

*Primary Examiner* — Nikita Wells
(74) *Attorney, Agent, or Firm* — Kilpatrick Townsend & Stockton LLP

(57) ABSTRACT

Embodiments of the invention relate generally to an ultraviolet (UV) cure chamber for curing a dielectric material disposed on a substrate and to methods of curing dielectric materials using UV radiation. A substrate processing tool according to one embodiment comprises a body defining a substrate processing region; a substrate support adapted to support a substrate within the substrate processing region; an ultraviolet radiation lamp spaced apart from the substrate support, the lamp configured to transmit ultraviolet radiation to a substrate positioned on the substrate support; and a motor operatively coupled to rotate at least one of the ultraviolet radiation lamp or substrate support at least 180 degrees relative to each other. The substrate processing tool may further comprise one or more reflectors adapted to generate a flood pattern of ultraviolet radiation over the substrate that has complementary high and low intensity areas which combine to generate a substantially uniform irradiance pattern if rotated. Other embodiments are also disclosed.

15 Claims, 24 Drawing Sheets

U.S. PATENT DOCUMENTS

| | | | |
|---|---|---|---|
| 4,135,098 A | 1/1979 | Troue |
| 4,411,931 A | 10/1983 | Duong |
| 4,849,640 A | 7/1989 | Kruishoop |
| 5,136,491 A | 8/1992 | Kano |
| 5,184,053 A | 2/1993 | Maruo et al. |
| 5,228,206 A | 7/1993 | Grant et al. |
| 5,440,137 A | 8/1995 | Sowers |
| 5,502,310 A | 3/1996 | Niestrath et al. |
| 5,705,232 A | 1/1998 | Hwang et al. |
| 5,973,331 A | 10/1999 | Stevens et al. |
| 6,098,637 A | 8/2000 | Parke |
| 6,264,802 B1 | 7/2001 | Kamrukov et al. |
| 6,284,050 B1 | 9/2001 | Shi et al. |
| 6,323,601 B1 | 11/2001 | Klein et al. |
| 6,331,480 B1 | 12/2001 | Tsai et al. |
| 6,342,702 B1 | 1/2002 | Jinbo et al. |
| 6,348,669 B1 | 2/2002 | Rudd Little et al. |
| 6,380,270 B1 | 4/2002 | Yates |
| 6,457,846 B2 | 10/2002 | Cook et al. |
| 6,475,930 B1 | 11/2002 | Junker et al. |
| 6,559,460 B1 | 5/2003 | Keogh et al. |
| 6,566,278 B1 | 5/2003 | Harvey et al. |
| 6,614,181 B1 | 9/2003 | Harvey et al. |
| 6,619,819 B2 | 9/2003 | Stowell et al. |
| 6,621,087 B1 | 9/2003 | Bisges et al. |
| 6,696,801 B2 | 2/2004 | Schmitkons et al. |
| 6,717,161 B1 | 4/2004 | Cekic et al. |
| 6,732,451 B2 | 5/2004 | Conwell et al. |
| 6,756,085 B2 | 6/2004 | Waldfried et al. |
| 6,894,285 B2 | 5/2005 | Kleinschmidt et al. |
| 7,077,547 B2 | 7/2006 | Schmitkons et al. |
| 7,119,904 B2 | 10/2006 | Coffin et al. |
| 7,126,687 B2 | 10/2006 | Hill et al. |
| 7,362,416 B2 | 4/2008 | Ito et al. |
| 7,411,203 B2 | 8/2008 | Fomenkov et al. |
| 7,449,704 B2 | 11/2008 | Fomenkov et al. |
| 7,499,154 B2 | 3/2009 | Stock et al. |
| 7,566,891 B2 * | 7/2009 | Rocha-Alvarez et al. ............ 250/504 R |
| 7,589,336 B2 * | 9/2009 | Kaszuba et al. ............ 250/504 R |
| 7,692,171 B2 * | 4/2010 | Kaszuba et al. ............ 250/504 R |
| 7,777,198 B2 * | 8/2010 | Rocha-Alvarez et al. ............ 250/455.11 |
| 7,909,595 B2 * | 3/2011 | Kaszuba et al. ............ 425/174.4 |
| 2005/0064298 A1 | 3/2005 | Silverman |
| 2006/0249078 A1 | 11/2006 | Nowak et al. |
| 2006/0249175 A1 | 11/2006 | Nowak et al. |
| 2006/0251827 A1 | 11/2006 | Nowak et al. |
| 2007/0228289 A1 | 10/2007 | Kaszuba et al. |
| 2007/0228618 A1 | 10/2007 | Kaszuba et al. |
| 2007/0257205 A1 | 11/2007 | Rocha-Alvarez et al. |
| 2007/0286963 A1 | 12/2007 | Rocha-Alvarez et al. |
| 2007/0287091 A1 | 12/2007 | Jacobo et al. |
| 2007/0295012 A1 | 12/2007 | Ho et al. |
| 2008/0067425 A1 | 3/2008 | Kaszuba et al. |
| 2008/0075858 A1 | 3/2008 | Koh |
| 2008/0277600 A1 | 11/2008 | Treichel et al. |

FOREIGN PATENT DOCUMENTS

| | | |
|---|---|---|
| DE | 102004038592 A1 | 3/2006 |
| WO | WO 2006/015694 A1 | 2/2006 |

OTHER PUBLICATIONS

Nordson Corporation, "CoolWave® 410 System," dated Dec. 2005, 2 pages, UVL-05-3786.

Nordson Corporation, "CoolWave® 610 System," Nordson Corporation, dated Nov. 2005, 2 pages, UVL-05-3116.

Maitland, "Cure—UV Printing & Coating Facts Worth Knowing," Nordson, dated Mar. 20, 2004, 5 pages.

Primarc UV Technology, "About UV Curing Technology," downloaded from the Internet: <<http://www.primarcuv.com/aboutuv.htm>>, Dec. 22, 2005, 5 pages.

Search Report of Singaporean Patent Application No. 200701946-6, dated Aug. 8, 2007, 7 pages. total.

Notice of Allowance for U.S. Appl. No. 11/686,878 mailed on May 15, 2009; 10 pages.

Notice of Allowance for U.S. Appl. No. 11/686,881 mailed on Jun. 11, 2010; 6 pages.

Non-Final Office Action for U.S. Appl. No. 11/686,881 mailed on Jan. 27, 2010; 23 pages.

Notice of Allowance for U.S. Appl. No. 11/686,897 mailed on Jun. 23, 2009; 7 pages.

Non-Final Office Action for U.S. Appl. No. 11/686,897 mailed on Mar. 17, 2009; 10 pages.

Notice of Allowance for U.S. Appl. No. 11/686,900 mailed on Nov. 23, 2009; 5 pages.

Non-Final Office Action for U.S. Appl. No. 11/686,900 mailed on Jun. 22, 2009; 10 pages.

Final Office for U.S. Appl. No. 11/686,901 mailed on Jun. 28, 2010; 16 pages.

Non-Final Office for U.S. Appl. No. 11/686,901 mailed on Feb. 17, 2010; 14 pages.

Non-Final Office for U.S. Appl. No. 11/686,901 mailed on Jun. 17, 2009; 24 pages.

Notice of Allowance for U.S. Appl. No. 11/686,901 mailed on Jan. 26, 2011; 4 pages.

Notice of Allowance for U.S. Appl. No. 11/686,901 mailed on Dec. 10, 2011; 6 pages.

U.S. Appl. No. 12/976,746, filed Dec. 22, 2010, Kaszuba et al.

* cited by examiner

Primary Reflector (asymmetric) - dual lamp

*Primary (asymmetric) + Secondary Reflector - dual lamp*

APPARATUS AND METHOD FOR EXPOSING A SUBSTRATE TO A ROTATING IRRADIANCE PATTERN OF UV RADIATION

CROSS-REFERENCES TO RELATED APPLICATIONS

This application is a division of U.S. patent application Ser. No. 11/686,881, filed Mar. 15, 2007; which is a continuation-in-part of U.S. patent application Ser. No. 11/124,908, filed May 9, 2005; and claims priority to U.S. Provisional Application No. 60/783,421, filed Mar. 17, 2006; U.S. Provisional Application No. 60/816,660, filed Jun. 26, 2006; U.S. Provisional Application No. 60/816,723, filed Jun. 26, 2006; and U.S. Provisional Application No. 60/886,906, filed Jan. 26, 2007 are herein incorporated herein by reference in their entirety.

This application is related to U.S. application Ser. No. 11/686,901, filed Mar. 15, 2007; and to U.S. application Ser. No. 11/686,878, filed Mar. 15, 2007; and to U.S. application Ser. No. 11/686,900, filed Mar. 15, 2007; and to U.S. application Ser. No. 11/686,897, filed Mar. 15, 2007. Each of the applications listed above are assigned to Applied Materials, Inc., the assignee of the present invention and are hereby incorporated by reference.

BACKGROUND OF THE INVENTION

Materials such as silicon oxide ($SiO_x$), silicon carbide (SiC) and carbon doped silicon oxide ($SiOC_x$) films find widespread use in the fabrication of semiconductor devices. One approach for forming such silicon-containing films on a semiconductor substrate is through the process of chemical vapor deposition (CVD) within a chamber. For example, chemical reaction between a silicon supplying source and an oxygen supplying source may result in deposition of solid phase silicon oxide on top of a semiconductor substrate positioned within a CVD chamber. As another example, silicon carbide and carbon-doped silicon oxide films may be formed from a CVD reaction that includes an organosilane source including at least one Si—C bond.

Water is often a by-product of the CVD reaction of organosilicon compounds. As such, water can be physically absorbed into the films as moisture or incorporated into the deposited film as Si—OH chemical bond. Either of these forms of water incorporation are generally undesirable. Accordingly, undesirable chemical bonds and compounds such as water are preferably removed from a deposited carbon-containing film. Also, in some particular CVD processes, thermally unstable organic fragments of sacrificial materials need to be removed.

One common method used to address such issues is a conventional thermal anneal. The energy from such an anneal replaces unstable, undesirable chemical bonds with more stable bonds characteristic of an ordered film thereby increasing the density of the film. Conventional thermal anneal steps are generally of relatively long duration (e.g., often between 30 min to 2 hrs.) and thus consume significant processing time and slow down the overall fabrication process.

Another technique to address these issues utilizes ultraviolet radiation to aid in the post treatment of CVD silicon oxide, silicon carbide and carbon-doped silicon oxide films. For example, U.S. Pat. Nos. 6,566,278 and 6,614,181, both to Applied Materials, Inc. and incorporated by reference herein in their entirety, describe the use of UV light for post treatment of CVD carbon-doped silicon oxide films. The use of UV radiation for curing and densifying CVD films can reduce the overall thermal budget of an individual wafer and speed up the fabrication process. A number of various UV curing systems have been developed which can be used to effectively cure films deposited on substrates. One example of such is described in U.S. application Ser. No. 11/124,908, filed May 9, 2005, entitled "High Efficiency UV Curing System," which is assigned to Applied Materials and incorporated herein by reference for all purposes.

Despite the development of various UV curing chambers, further improvements in this important technology area are continuously being sought.

BRIEF SUMMARY OF THE INVENTION

Embodiments of the invention relate generally to an ultraviolet (UV) cure chamber for curing a dielectric material disposed on a substrate and to methods of curing dielectric materials using UV radiation.

A substrate processing tool according to one embodiment comprises a body defining a substrate processing region; a substrate support adapted to support a substrate within the substrate processing region; an ultraviolet radiation lamp spaced apart from the substrate support, the lamp configured to transmit ultraviolet radiation to a substrate positioned on the substrate support; and a motor operatively coupled to rotate at least one of the ultraviolet radiation lamp or substrate support at least 180 degrees relative to each other. The substrate processing tool may further comprise one or more reflectors adapted to generate a flood pattern of ultraviolet radiation over the substrate that has complementary high and low intensity areas which combine to generate a substantially uniform irradiance pattern if rotated.

A substrate processing tool according to another embodiment of the invention comprises a body defining a substrate processing region; a substrate support adapted to support a substrate within the substrate processing region; an ultraviolet (UV) radiation lamp spaced apart from the substrate support and configured to generate and transmit ultraviolet radiation to a substrate positioned on the substrate support, the UV radiation lamp comprising a source of UV radiation and a primary reflector partially surrounding the source of UV radiation, and a secondary reflector positioned between the primary reflector and the substrate support, the secondary reflector adapted to redirect ultraviolet radiation that would otherwise not contact the substrate towards the substrate. In some embodiments the secondary reflector comprises an upper portion and a lower portion each of which includes opposing longitudinal surfaces that meet at a vertex traversing a length of the longitudinal surfaces and opposing transverse surfaces extending between ends of the longitudinal surfaces.

A substrate processing tool according to another embodiment of the invention comprises a body defining a substrate processing region; a substrate support adapted to support a substrate within the substrate processing region; and a first UV lamp spaced apart from the substrate support and configured to transmit UV radiation to a substrate positioned on the substrate support, the first UV lamp comprising a first UV radiation source and a first reflector partially surrounding the first UV radiation source, the first reflector having opposing inner and outer reflective panels, the inner reflective panel having a first reflective surface and the outer reflective panel having a second reflective surface that is asymmetric to the first reflective surface. Some embodiments further include a second UV lamp spaced apart from the substrate support and configured to transmit UV radiation to a substrate positioned on the substrate support, the second UV lamp comprising a second UV radiation source and a second reflector partially surrounding the second UV radiation source, the second reflector opposing inner and outer reflective panels, the inner reflective panel having a third reflective surface and the outer reflective panel having a fourth reflective surface that is asymmetric to the third reflective surface.

A substrate processing tool according to another embodiment of the invention comprises a body defining a substrate processing region; a substrate support adapted to support a substrate within the substrate processing region; an ultraviolet (UV) radiation lamp spaced apart from the substrate support and configured to generate and transmit ultraviolet radiation to a substrate positioned on the substrate support, the UV radiation lamp comprising a source of UV radiation and a primary reflector partially surrounding the source of UV radiation; a secondary reflector positioned between the primary reflector and the substrate support configured to reduce light loss outside the substrate, the secondary reflector having an inner and outer surface and at least one hole traversing the reflector from the inner surface to the outer surface; and a light detector positioned to receive UV radiation light generated by the UV radiation lamp transmitted through the at least one hole.

A substrate processing tool according to another embodiment of the invention comprises a body defining a substrate processing region; a substrate support adapted to support a substrate within the substrate processing region; an ultraviolet (UV) radiation lamp spaced apart from the substrate support and configured to generate and transmit ultraviolet radiation to a substrate positioned on the substrate support, the UV radiation lamp comprising a source of UV radiation and a primary reflector partially surrounding the source of UV radiation; a secondary reflector positioned between the primary reflector and the substrate support configured to reduce light loss outside the substrate, the secondary reflector having an inner and outer surface and at least one hole traversing the reflector from the inner surface to the outer surface; and a light detector positioned to receive UV radiation light generated by the UV radiation lamp transmitted through the at least one hole.

A substrate processing tool according to another embodiment of the invention comprises a body defining a substrate processing region; a substrate support adapted to support a substrate within the substrate processing region; and an ultraviolet (UV) radiation lamp spaced apart from the substrate support and configured to generate and transmit ultraviolet radiation to a substrate positioned on the substrate support, the UV radiation lamp comprising a source of UV radiation and a primary reflector partially surrounding the source of UV radiation, the primary reflector having a reflective surface that includes at least one parabolic section and at least one elliptical section. In one embodiment the primary reflector comprises inner and outer reflective panels each of which has a reflective surface that includes at least one parabolic section and at least one elliptical section.

A method of curing a layer of dielectric material formed over a substrate according to one embodiment comprises placing the substrate having the dielectric material formed thereon on a substrate support in a substrate processing chamber; and exposing the substrate to ultraviolet radiation from a source of ultraviolet radiation that is spaced apart from the substrate support while rotating either the ultraviolet radiation source and/or substrate during the exposing step. The exposing step in some embodiments includes generating a substantially circular flood pattern having complementary high and low intensity areas which combine to generate a substantially uniform irradiance pattern during rotation during the exposing step.

A method of curing a layer of dielectric material formed over a substrate according to another embodiment comprises placing the substrate having the dielectric material formed thereon on a substrate support in a substrate processing chamber; exposing the substrate to ultraviolet radiation by generating a substantially rectangular flood pattern of UV radiation with a UV source and primary reflector and reshaping the substantially rectangular flood pattern into a substantially circular flood pattern of UV radiation with a secondary reflector positioned between the primary reflector and the substrate support.

A method of curing a layer of dielectric material formed over a substrate, the method comprising placing the substrate having the dielectric material formed thereon on a substrate support in a substrate processing chamber; and exposing the substrate to UV radiation by generating the radiation with an elongated UV source and redirecting the UV radiation generated by the UV source with first and second reflective surfaces that partially surround the radiation source and are asymmetric to each other. A method of curing a layer of dielectric material formed over a substrate according to another embodiment comprises placing the substrate having the dielectric material formed thereon on a substrate support in a substrate processing chamber; and exposing the substrate to UV radiation by (i) generating the radiation with first and second UV sources, (ii) redirecting UV radiation generated by the first UV source with first and second reflective surfaces that are asymmetric to each other and combine to concentrate the UV radiation on a first half of the substrate, and (iii) redirecting UV radiation generated by the second UV source with third and fourth reflectors that are asymmetric to each other and combine to concentrate the UV radiation on a second half of the substrate opposite the first half.

A method of curing a layer of dielectric material formed over a substrate according to another embodiment comprises placing the substrate having the dielectric material formed thereon on a substrate support in a substrate processing chamber; and exposing the substrate to UV radiation by generating the radiation with an elongated UV source and redirecting the UV radiation generated by the UV source with opposing first and second reflective surfaces that partially surround the radiation source where at least one of the opposing first and second surfaces includes at least one parabolic section and at least one elliptical section.

These and other embodiments of the present invention, as well as its advantages and features, are described in more detail in conjunction with the text below and attached figures.

DETAILED DESCRIPTION OF THE INVENTION

Figure 1:
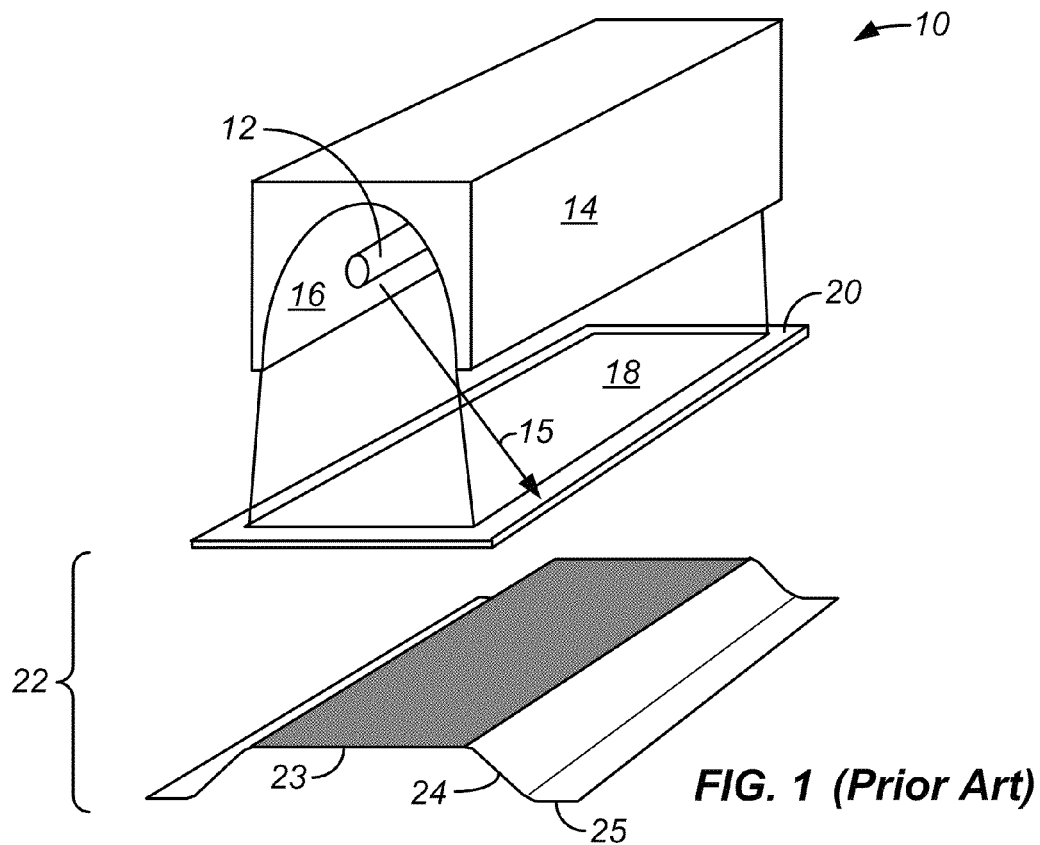
FIG. 1 is a perspective view of a prior art UV lamp that illustratively depicts an approximate irradiance level of light generated by the lamp over an exposure area.

FIG. 1 is a perspective view of a prior art microwave UV lamp 10 that illustratively depicts an irradiance level of radiation generated by the lamp over a substantially rectangular exposure area. Lamp 10 includes an elongated UV bulb 12 mounted within a housing 14. Housing 14 includes a reflector 16 that faces UV bulb 12 and directs UV radiation into a flood pattern 18 over a substrate 20. Reflector 16 is placed inside a resonant cavity, which limits the size and shape of the reflector.

While reflector 16 reflects the majority of radiation (within selected wavelengths) that strikes its surface within flood pattern 18, some radiation escapes the reflector surface and falls outside the boundaries of pattern 18. An example of such radiation is illustrated in FIG. 1 by radiation path 15. The intensity of radiation generated by lamp 10 both within and outside flood pattern 18 is illustrated conceptually (in a simplified manner) in bottom portion 22 of FIG. 1. As shown in bottom portion 22, the intensity of UV radiation generated by lamp 10 is essentially (or close to) uniform within the boundary of flood pattern 18 (flat line 23). Some radiation falls outside of region 18 in an amount that decreases with the distance from the boundary as shown by sloped line 24 until the radiation level reaches zero as shown by line 25.

UV lamp modules similar to lamp 10 have been used to cure dielectric materials deposited over substantially round semiconductor substrates. One problem with such use, however, is that because of its shape, in order to expose the entire semiconductor substrate, the substantially rectangular exposure pattern generated by lamp 10 necessarily produces a certain amount of radiation that is outside the boundaries of the substrate.

Figure 2:
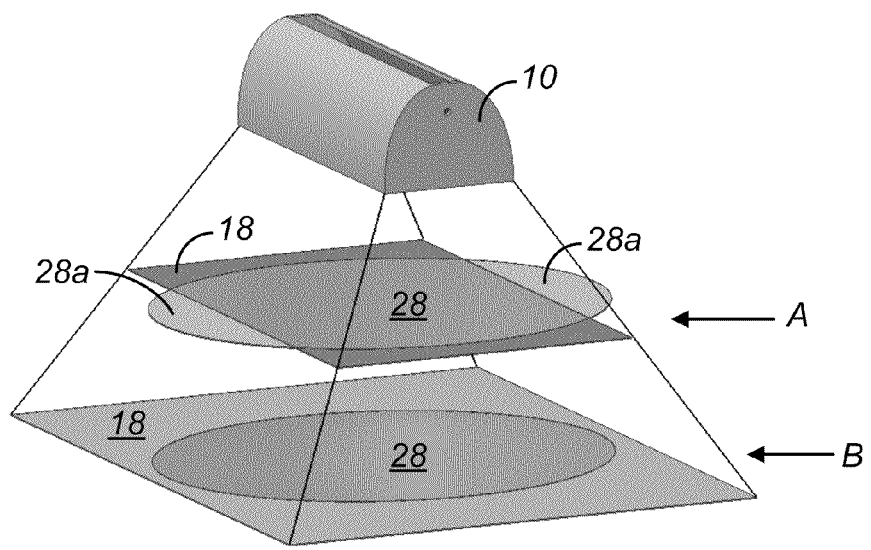
FIG. 2 is a simplified depiction of the primary irradiance pattern of a prior art UV lamp at different lamp-to-wafer distances.

This problem is illustrated graphically in FIG. 2, which depicts the irradiance outline at different wafer-to-lamp distances. As shown in FIG. 2, if a round substrate 28 is positioned relatively close to lamp 10 (position A), portions of the substrate (e.g., portions 28a) fall outside the primary irradiance pattern 18. Moving the substrate further from UV lamp 10 (position B) can result in the entire substrate falling within the irradiance pattern but will also result in a substantial portion of radiation in the primary irradiance pattern falling outside the boundaries of the substrate.

Another problem with such use is that even where the edge of boundary 18 is matched with an outer edge of the substrate, radiation that corresponds to sloped line 24 (FIG. 1) would also fall outside the boundary of the substrate. Generally it is desirable to concentrate as much uniform UV radiation over the surface of the substantially circular semiconductor substrate as possible. The problems described above in conjunction with a prior art lamp run counter to such an ideal exposure.

Figure 3:
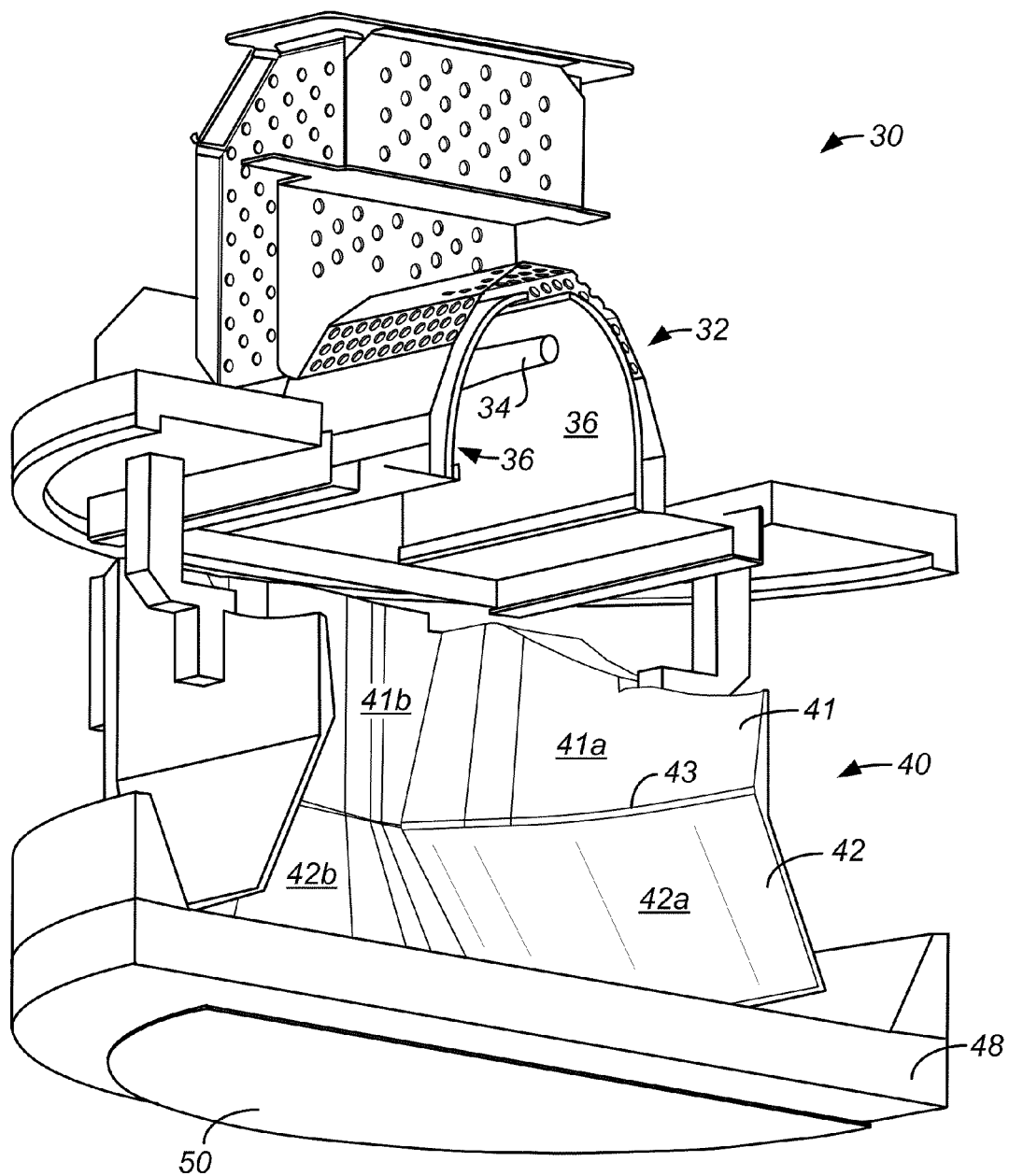
FIG. 3 is cross-sectional perspective view of a UV lamp module that includes a secondary reflector according to one embodiment of the present invention.

FIG. 3 is cross-sectional perspective view of a UV lamp module 30 according to an embodiment of the present invention that includes a secondary reflector 40 designed to increase the intensity of energy distributed to a substrate. Lamp module 30 also includes a UV lamp 32 (e.g., a high power mercury microwave lamp) having an elongated UV bulb 34 partially surrounded by a primary reflector 36. As shown in FIG. 3, secondary reflector 40 is positioned between UV lamp 32 and a semiconductor substrate 50. The lower edge of the reflector has a diameter that is smaller than a diameter of the substrate so there is no optical gap between the secondary reflector and the outside diameter of the substrate as viewed from the direction of the lamp.

A UV transparent window 48 (e.g., a quartz window) is positioned between lamp 32 and substrate 50 and a small gap exists between the bottom of the secondary reflector and the UV transparent window to allow for air flow around the secondary reflector. In one embodiment the distance between the upper surface of substrate 50 that is exposed to UV radiation and the bottom of secondary reflector 40, which includes the thickness of window 48, is approximately 1.5 inches. Because of the smaller diameter of the lower reflector edge as compared to the substrate diameter, loss of light to the substrate is minimal despite the spacing.

Figure 4:
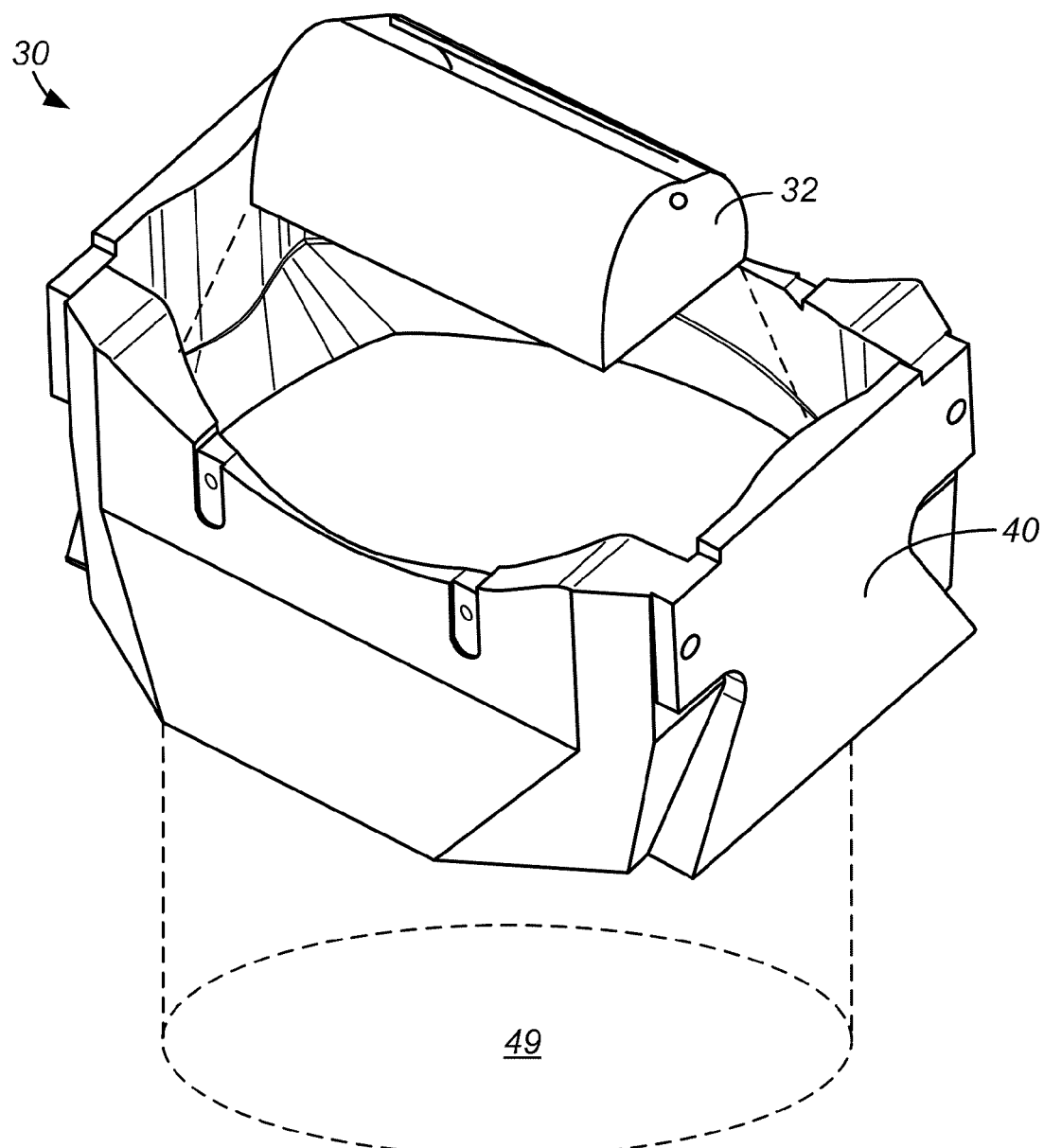
FIG. 4 is a simplified depiction of the irradiance pattern of UV lamp module 30 according to an embodiment of the invention.

The secondary reflector has a channeling effect reflecting UV radiation that would otherwise fall outside the boundary of the primary reflector's flood pattern (e.g., radiation 15 in FIG. 1) so that such radiation impinges upon the substrate being treated thus increasing the intensity of the energy distributed to the substrate. As shown in FIG. 4, secondary reflector 40 alters the flood pattern of UV lamp 32 from a substantially rectangular area (e.g., as shown in FIG. 1) to a substantially circular shape 49 that corresponds to the substantially circular semiconductor substrate being exposed.

Figure 5:
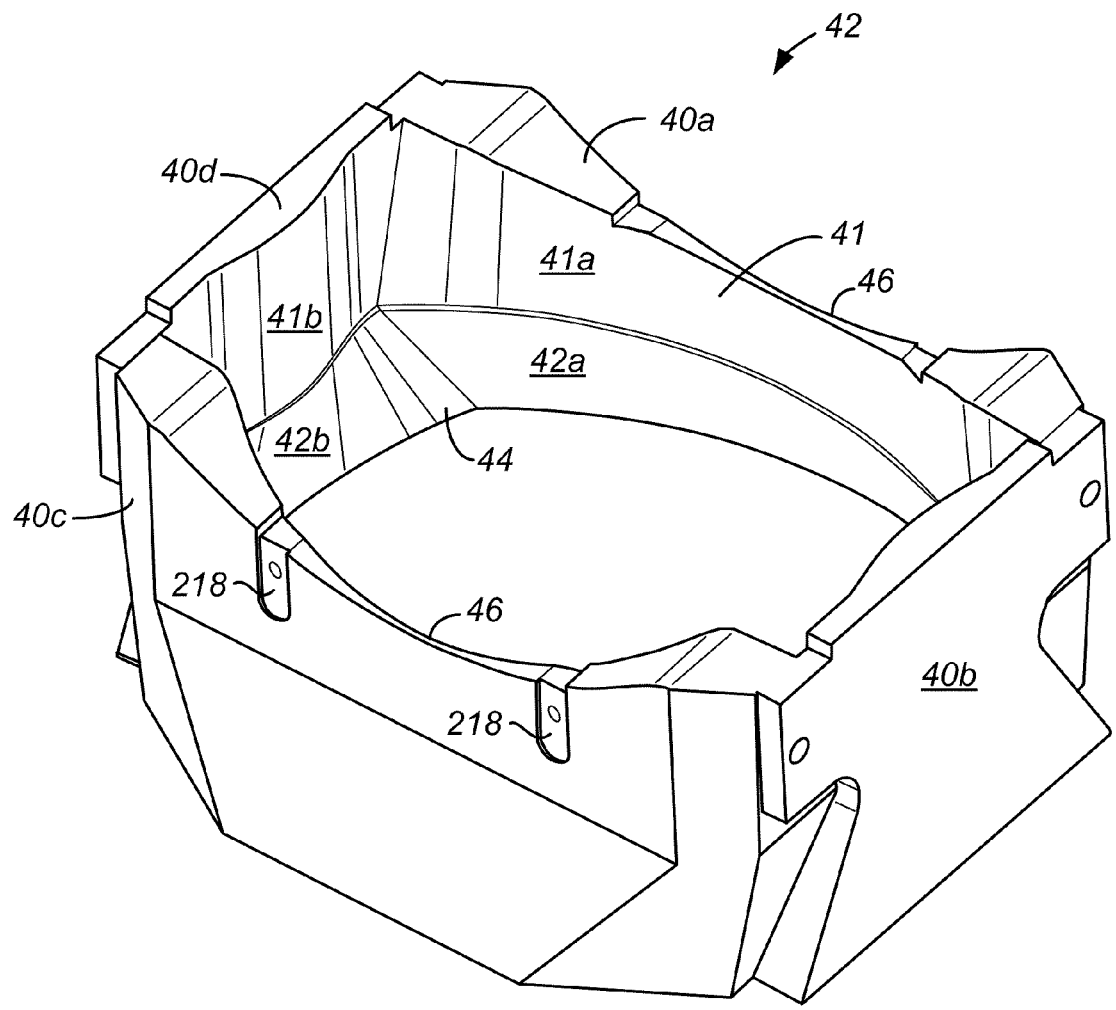
FIG. 5 is a top perspective view of the secondary reflector 42 depicted in FIG. 3.

Referring now to both FIGS. 3 and 5, which is a top perspective view of secondary reflector 40 depicted in FIG. 3, the secondary reflector includes an upper portion 41 and a lower portion 42 which meet at a vertex 43 that extends around the interior perimeter of reflector 40. Upper portion 41 includes a semicircular cut-out 46 to allow unobstructed flow of lamp cooling air. Upper portion 41 also includes two opposing and generally inward sloping (from the top) longitudinal surfaces 41a and two opposing transverse surfaces 41b. Transverse surfaces 41b are generally vertical and have a convex surface along the transverse direction. Longitudinal surfaces 41a are generally concave along the longitudinal direction.

Lower portion 42, which is positioned directly below upper portion 41, includes two opposing and generally outward sloping (from the top) surfaces 42a and two opposing generally outward sloping transverse surfaces 42b. In the embodiment shown in FIGS. 3 and 5, surfaces 42b are at a reduced angle (relative to the vertical) than surfaces 42a. Longitudinal surfaces 42a are generally concave along the longitudinal direction while surfaces 42b are generally convex (with a notable exception being in corners 44 where the lower portion of surface 42a meets the lower portion of surface 42b) along the transverse direction.

As evident from FIGS. 3 and 5, secondary reflector 40 represents a complex shape that can be customized to a particular UV radiation source and primary reflector. Secondary reflector 40 can also be customized (in conjunction with primary reflectors 36 when used) to particular irradiance profiles and uniformity levels depending on the requirements of an application. For example, in some embodiments reflector 40 can be designed to generate an edge high irradiance profile in order to compensate for a heater thermal profile that is center high. Also, secondary reflector 40 will generally be designed to generate different irradiation patterns depending on whether it is used with a stationary or rotational lamp as discussed below.

The inventors designed the embodiment shown in FIGS. 3 and 5 using a commercially available Monte Carlo raytracing simulation program, TracePro by Lambda Research Corporation. The inventors arrived at the final optimized design for the secondary reflector using an iterative process that simulated one million rays generated by a radiation source. Persons of skill in the art will recognize that a variety of different simulation programs and other techniques can be employed to derive a particular secondary reflector that is appropriate for a particular UV radiation source and primary reflector pairing.

In one embodiment secondary reflector 40 is fabricated from four separate machined aluminum pieces 40a, 40b, 40c and 40d where the inner surfaces of pieces 40a and 40c define opposing surfaces 41a and opposing surfaces 42a, and the inner surfaces of pieces 40b and 40d define opposing surfaces 41b and opposing surfaces 42b. Each of surfaces 41a, 41b, 42a and 42b preferably includes an optically smooth finish and can optionally be coated with a dichroic coating similar to that described below with respect to the primary reflector. In other embodiments secondary reflector 40 can be made up of more or fewer than four pieces and in some embodiments secondary reflector 40 can be machined from a single block of material. In another embodiment secondary reflector 40 is made from quartz having inner reflective surfaces coated with a dichroic coating.

Figure 6A:
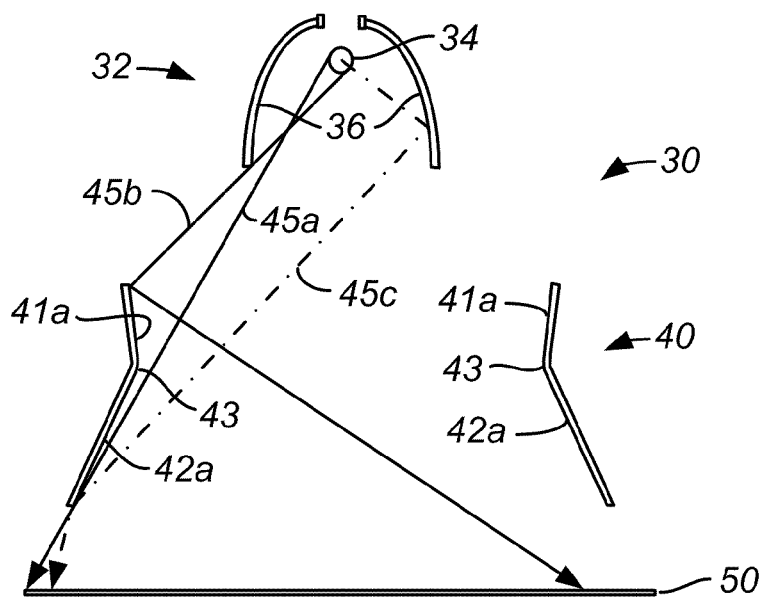
FIG. 6A is a simplified cross-sectional illustration along an axis transverse to UV lamp module 30 of several reflection paths for UV radiation generated by a UV lamp module according to an embodiment of the present invention.
Figure 6B:
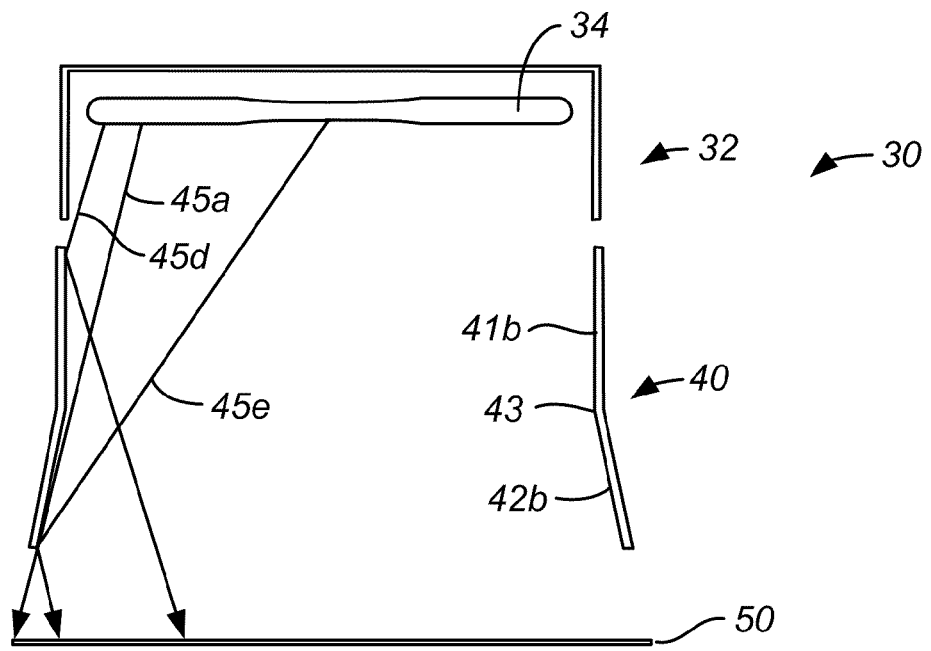
FIG. 6B is a simplified cross-sectional illustration along an axis longitudinal to UV lamp module 30 of several reflection paths for UV radiation generated by a UV lamp module according to an embodiment of the present invention.

FIG. 6A is a simplified cross-sectional illustration along a transverse axis of UV lamp module 30 showing several reflection paths for UV radiation according to an embodiment of the present invention. FIG. 6B is a simplified cross-sectional illustration along a longitudinal axis of UV lamp module 30 illustrating additional reflection paths for UV radiation according to an embodiment of the present invention. As shown in FIGS. 6A and 6B, secondary reflector 40 allows substantially all UV radiation generated by bulb 34 to be directed towards and impinge upon a substrate 50 positioned below the UV lamp module. In some embodiments a quartz window or similarly UV transparent window, which is not shown in either FIG. 6A or 6B for ease of illustration, may be present between the lower surface of module 30 and substrate 50 as described above with respect to FIG. 3.

FIG. 6A shows radiation from lamp 34 impinging upon substrate 50 by one of three different exemplary paths: a path 45a that strikes substrate 50 directly without being reflected from either primary reflector 36 or secondary reflector 40, a path 45b that strikes substrate 50 after being reflected by upper portion 41a of secondary reflector 40 and a path 45c that strikes substrate 50 after being reflected by lower portion 42a of reflector 40. FIG. 6B shows radiation from lamp 34 impinging upon substrate 50 by one of several additional exemplary paths: a second path 45a that strikes substrate 50 directly without being reflected off of either primary reflector 36 or secondary reflector 40, a path 45d that strikes substrate 50 after being reflected by upper portion 41b of secondary reflector 40 and a path 45e that strikes substrate 50 after being reflected by lower portion 42b of reflector 40. It is to be understood that the paths 45a to 45e shown in FIGS. 6A and 6B are exemplary paths only and that many other reflection paths will be generated by secondary reflector 40 including some relatively complicated paths in which radiation is reflected upon multiple points of the secondary reflector as, for example, may be the case where radiation first contacts upper portion 41 in an area near the corner where parts 40a and 40d intersect.

Referring back to FIG. 3, the secondary reflector employed in some embodiments of the present invention can be employed with any of a number of different UV lamps. In the embodiment illustrated in FIG. 3, UV lamp 32 includes a single elongated UV bulb 34 and a pair of interior reflective panels 36 positioned in an opposing and facing orientation spaced from bulb 34. Reflector 36 is mounted in a spaced relationship with respect to bulb 34. Bulb 34 and reflective panels are both positioned inside an elongated resonant cavity (which for ease of illustration, is not shown). Each reflective panel 36 extends longitudinally along the length of the UV bulb and includes a concave inner surface that has an optically smooth finish. Note, that FIG. 3 shows panels 36 as a pair of separate unconnected panels for ease of illustration, embodiments of the invention are not limited to such. In some embodiments, reflector panels 36 are connected as a single U-shaped component that may include holes or apertures above bulb 34 to allow air flow across the bulb.

Reflective panels 36 affect the irradiance profile across the lamp and are designed to compensate for direct light non-uniformity (irradiance along the lamp is a function of distance from the center of the lamp). In one embodiment in which a single UV lamp 32 is used to irradiate a substrate, the pair of reflective panels 36 have opposing symmetric reflective surfaces. In some embodiments of the invention, for example when two or more two or more UV lamps 32 are used to irradiate a substrate, asymmetric pairs of reflective panels 36 in individual UV lamps are used as described more fully below. Reflective panels 36 may be either elliptical or parabolic reflectors or include a combination of both elliptical and parabolic reflective portions. The inventors have found that elliptical reflectors can fit in a smaller resonant cavity for the same width of light beam than parabolic reflectors and can also achieve superior light uniformity as compared to parabolic reflectors. The inventors have also found, however, that reflective panels having both elliptical and parabolic sections allow for the greatest flexibility in creating reflection patterns tailored to an applications particular needs as described more fully below.

As used herein, an elliptical reflector need not have a true or perfect ellipse shape. Instead, a reflector that has a partial or semi-elliptical shape that does not have a clearly defined focal point is also referred to as an elliptical reflector. Similarly, a parabolic reflector need not have a true or perfect parabolic shape. Instead, a reflector that has a partial or semi-parabolic shape that reflects rays that are not exactly parallel is also referred to as a parabolic reflector.

Referring back to FIG. 3, the interior surface of each reflector panel 36 is defined by a cast quartz lining coated with a dichroic coating. The quartz lining reflects UV radiation emitted from UV bulb 34. The dichroic coating comprises a periodic multilayer film composed of diverse dielectric materials having alternating high and low refractive indices that does not reflect all of the damaging heat-generating infrared radiation. Thus, reflector panels 36 function as a cold mirror. A UV lamp 32 suitable for use with the present invention can be commercially purchased from, for example, Nordson Corporation in Westlake, Ohio or by Miltec UV in Stevenson, Md. In one embodiment, UV lamp 32 includes a single elongated UV H+ bulb from Miltec. In other embodiments, UV lamp 32 may include an elongated UV source formed from two or more separate elongated bulbs, any array of UV bulbs or other configuration. Embodiments of the invention are not limited to a particular UV lamp or bulb type.

In some embodiments of the invention, reflective panels 36 are designed (in conjunction with secondary reflector 40 when a secondary reflector is employed) to create an irradiance pattern that is tailored to a particular application. For example, in an application that rotates the UV lamp with respect to the substrate during the treatment process, reflective panels 36 can be designed to generate an irradiance profile having complementary high and low intensity areas such that when the substrate is rotated the complementary areas compensate for each other to create a desired uniform irradiance exposure as described with respect to FIGS. 11A-D. Other applications may employ an exposure pattern that compensates for non-uniform properties in an as-deposited film in order to generate a final, cured film having improved uniformity. For example, in an application in which an as-deposited film is center thick (i.e., a film that has a thickness in the center of the substrate that is greater than its thickness near the periphery of the substrate), reflective panels 36 can be tailored to generate an irradiance pattern that has a higher intensity in the center of the substrate corresponding to the area of greater deposition. Similarly, in an application where it is known that a particular region of a deposited film has more volatile labile species than other regions, reflective panels can be tailored to generate an irradiance pattern that has a higher intensity in the area(s) of the substrate corresponding to the greater labile species.

Figure 7A:
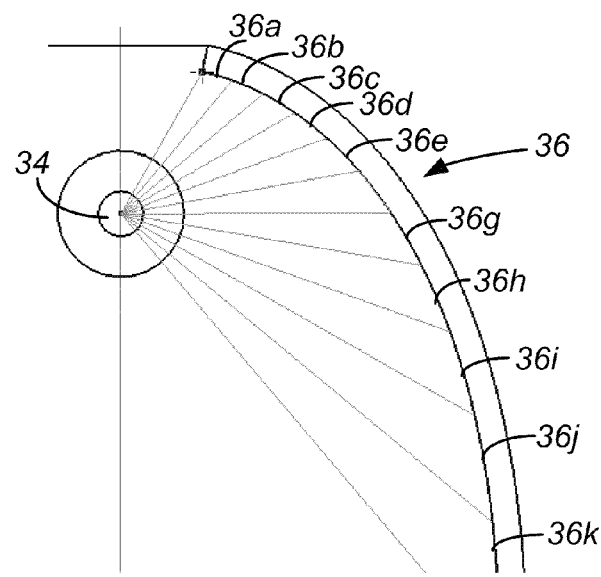
FIGS. 7A-7B are a simplified cross-sectional views of primary reflector 36 shown in FIG. 3 depicting selected reflective paths generated by the reflector according to one embodiment of the invention.
Figure 7B:
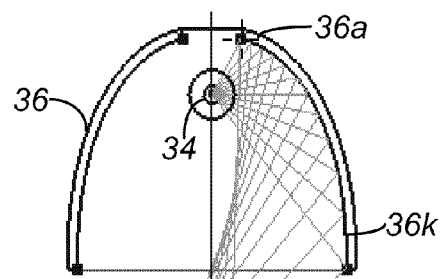
Figure 7B:
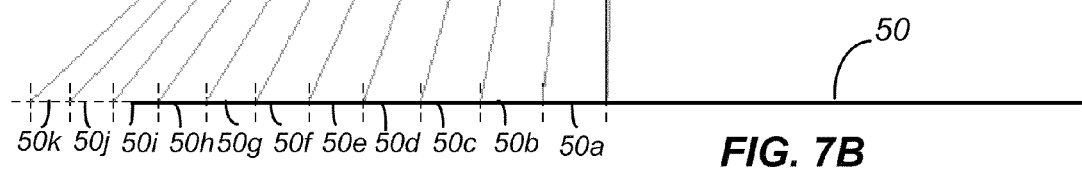

In one particular embodiment employing elliptical reflector panels 36, the profile of the interior surfaces of panels 36 is generated by dividing rays emitted from UV bulb 34 into equal angular sections within the space dictated by the resonant cavity where each angular section represents the same amount of energy emitted by bulb 34. Such an embodiment is illustrated in FIG. 7a where reflector sections 36a-36k of an elliptical reflector 36 are shown. Section 36a is designed to reflect UV radiation towards the center of the substrate. Each successive section 36b-36k is then designed to reflect UV radiation just outside the previous section as illustrated in FIG. 7b where sections 36a-36k are shown to redirect UV radiation to respective portions 50a-50k of the substrate 50. The length of each interval 50a-50k is a function of the distance between the lamp and substrate, the ray incidence angle, the direct light profile and the reflection coefficient. A smooth continuous elliptical profile, such as that shown in FIGS. 7A and 7B is less sensitive to reflector surface imperfections and reflector alignment accuracy. While FIGS. 7A and 7B illustrate reflector panel 36 being divided into eleven different sections, one embodiment of the invention divides panel 36 into forty equal angular sections.

Figure 7C:
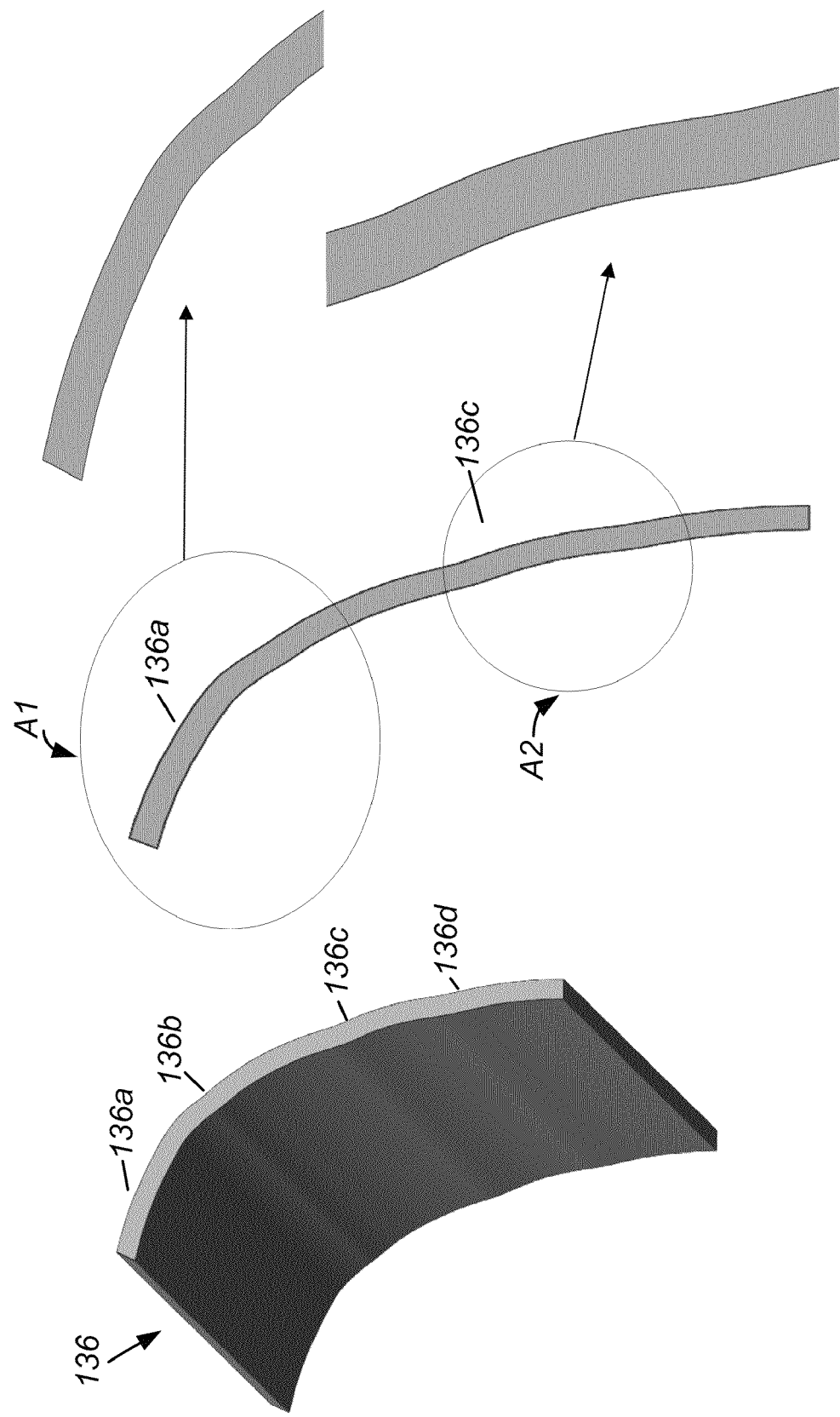
FIG. 7C includes a simplified perspective, cross-sectional and partial exploded view of a primary reflector that includes a reflective surface having both parabolic and elliptical shaped sections according to one embodiment of the invention.

In another embodiment each reflector 36 includes one or more parabolic shaped sections and one or more elliptical shaped sections. FIG. 7C illustrates such a combinational parabolic and elliptical reflector 136. A UV lamp 32 may include inner and outer elliptical reflectors 136 arranged around an elongated bulb 34. Furthermore, inner and outer reflectors 136 may be asymmetrically shaped in order to more particularly tailor the irradiance profile to a particular application.

Figure 7D:
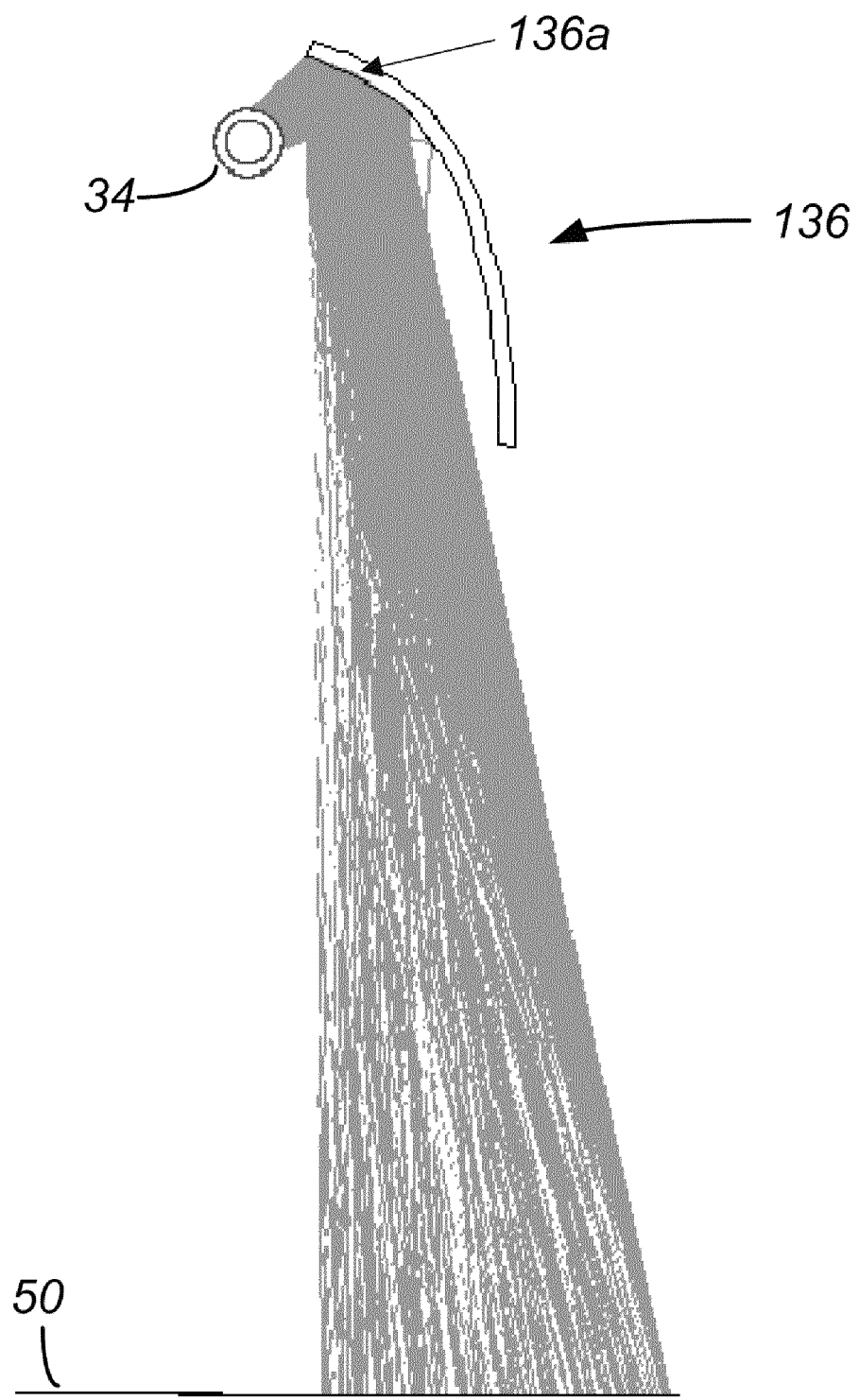
FIG. 7D is a simplified cross-sectional view showing the reflective pattern of a parabolic section 136a of the reflector shown in FIG. 7C.
Figure 7E:
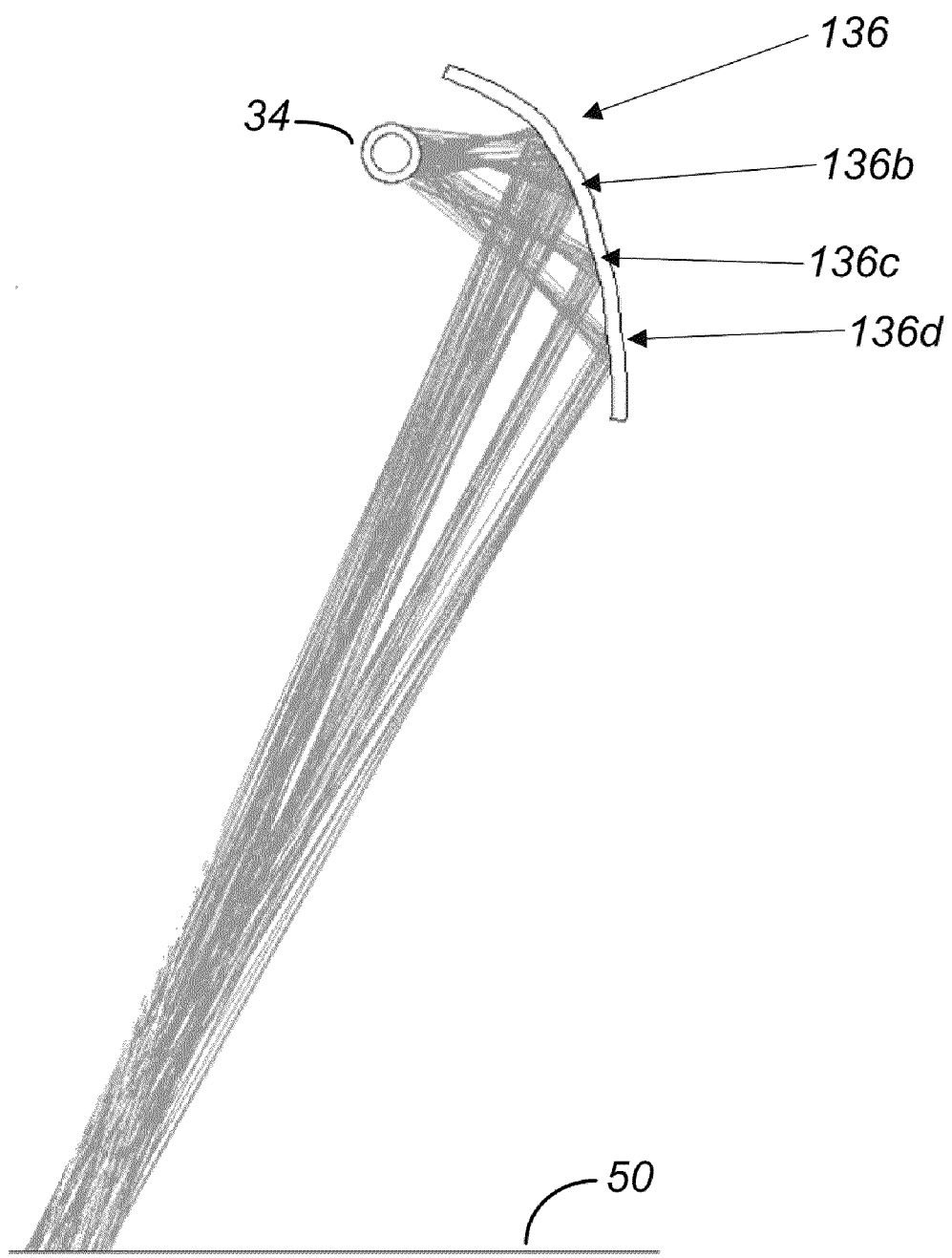
FIG. 7E is a simplified cross-sectional view showing the reflective pattern of elliptical sections 136b-136d of the reflector shown in FIG. 7C.

FIG. 7C includes a perspective view of reflector 136 on the left portion of the figure, a cross-sectional view of reflector 136 in the middle and an exploded cross-sectional view of portions A1 and A2 of reflector 136 on the far right. As shown in FIG. 7C, reflector 136 includes a single parabolic section 136a and multiple elliptical sections 136b, 136c and 136d which form a wave like surface as shown in the exploded view of portion A2. Parabolic section 136a reflects radiation to a selected area on substrate 50 as shown in FIG. 7D. Elliptical sections 136b-136d reflect radiation to a different selected area of substrate 50 as shown in FIG. 7E (note that direct rays are not shown in either of FIG. 7D or 7E for clarity). Each reflector 136 is designed in combination with UV bulbs 34 and secondary reflector 40 taking into account whether or not the UV lamp module and/or substrate is rotated during the cure process to generate a pattern that provides a high intensity yet highly uniform exposure on substrate 50. Other embodiments may include a different number of parabolic and/or elliptical reflector sections than those of reflector 136.

Figure 8:
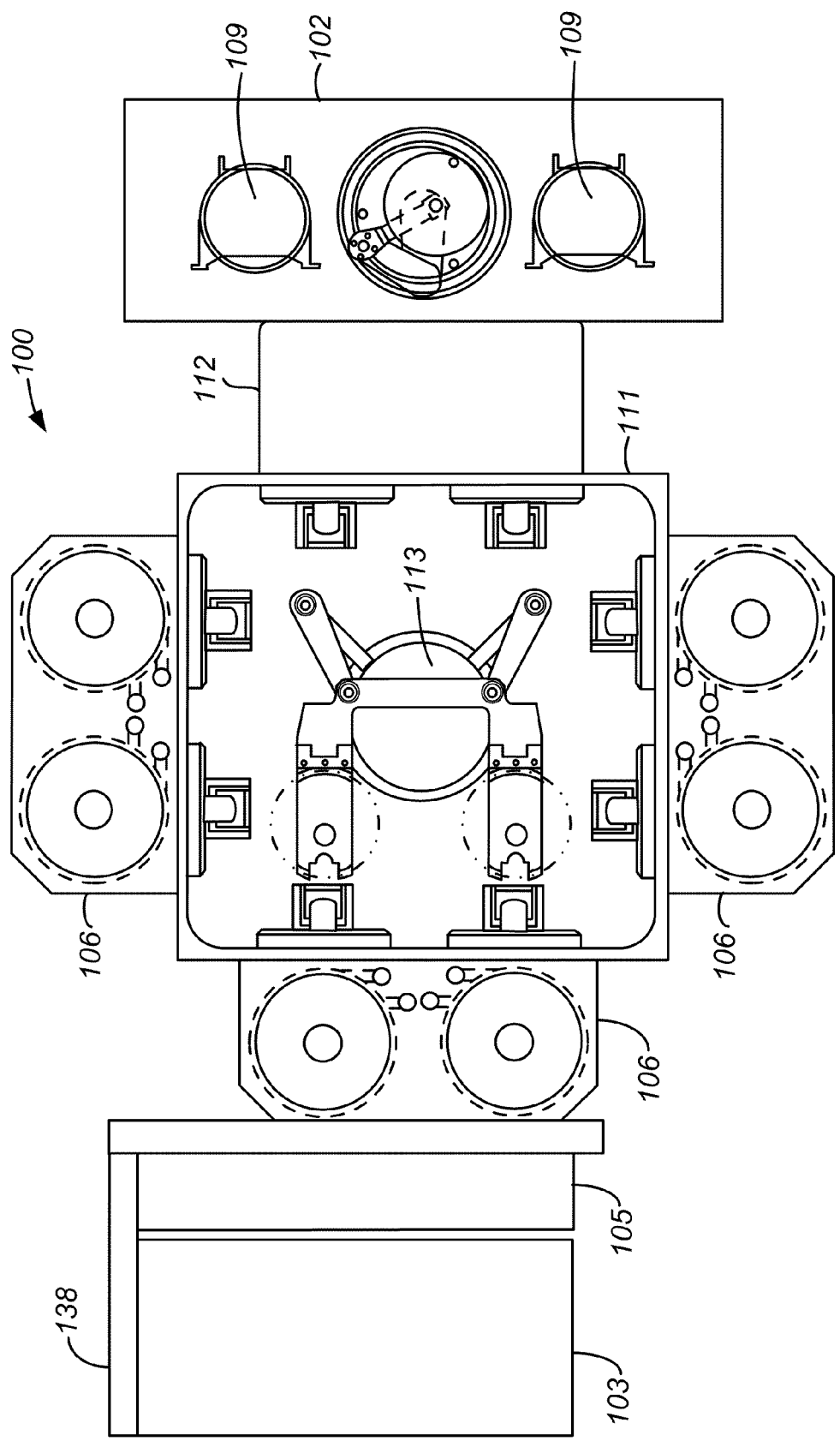
FIG. 8 is a simplified plan view of a semiconductor processing system in which embodiments of the invention may be incorporated.

FIG. 8 is a simplified plan view of a semiconductor processing system 100 in which embodiments of the invention may be incorporated. System 100 illustrates one embodiment of a Producer™ processing system, commercially available from Applied Materials, Inc., of Santa Clara, Calif. Processing system 100 is a self-contained system having the necessary processing utilities supported on a mainframe structure 101. Processing system 100 generally includes a front end staging area 102 where substrate cassettes 109 are supported and substrates are loaded into and unloaded from a loadlock chamber 112, a transfer chamber 111 housing a substrate handler 113, a series of tandem process chambers 106 mounted on the transfer chamber 111 and a back end 138 which houses the support utilities needed for operation of system 100, such as a gas panel 103 and a power distribution panel 105.

Figure 13:
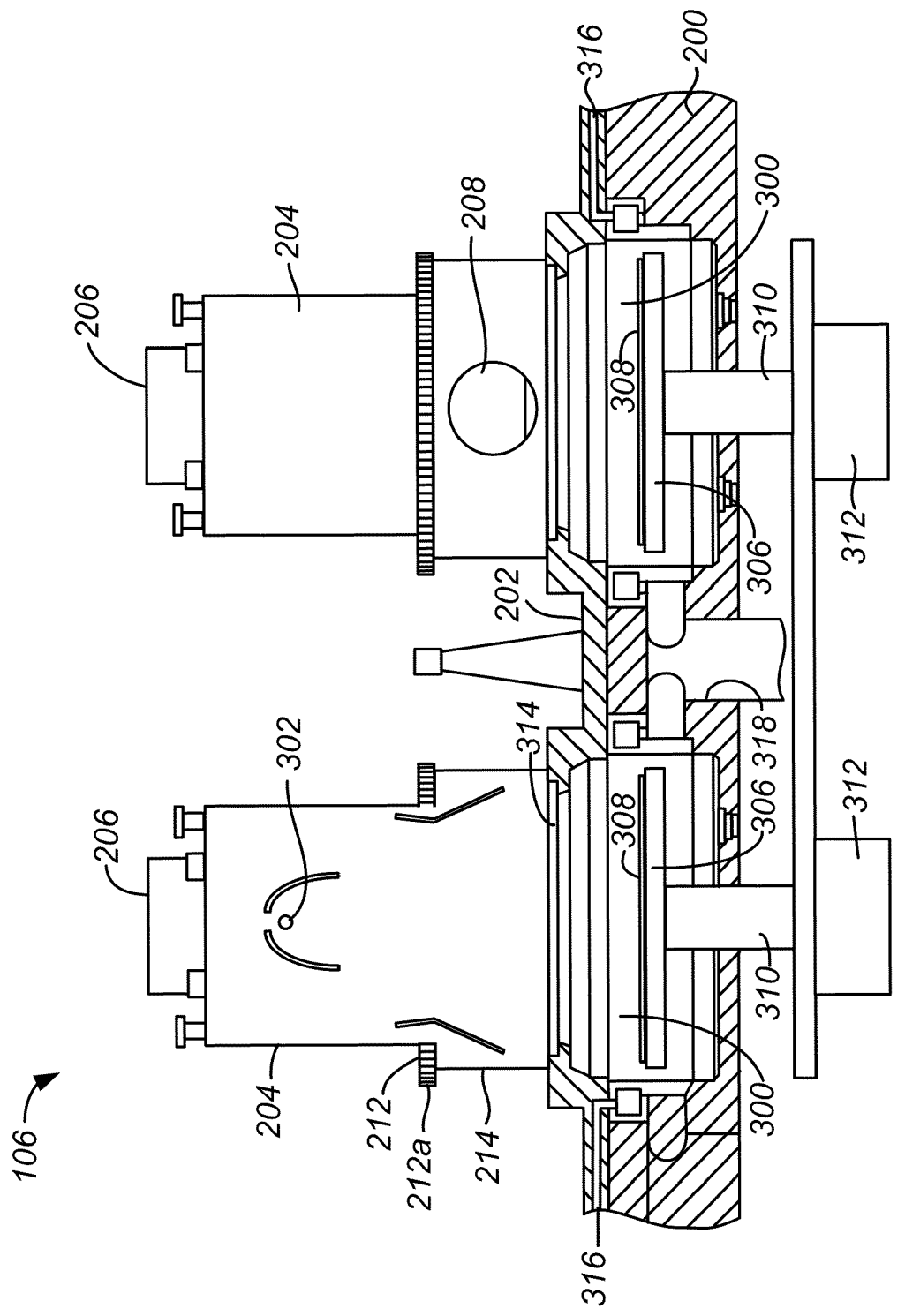
FIG. 13 is a simplified cross-sectional view of the tandem process chamber 106 illustrated in FIG. 8.

Each of the tandem process chambers 106 includes two processing regions for processing the substrates (see, FIG. 13). The two processing regions share a common supply of gases, common pressure control and common process gas exhaust/pumping system. Modular design of the system enables rapid conversion from any one configuration to any other. The arrangement and combination of chambers may be altered for purposes of performing specific process steps. Any of the tandem process chambers 106 can include a lid according to aspects of the invention as described below that includes one or more ultraviolet (UV) lamps for use in a cure process of a low K material on the substrate and/or in a chamber clean process. In one embodiment, all three of the tandem process chambers 106 have UV lamps and are configured as UV curing chambers to run in parallel for maximum throughput.

In an alternative embodiment where not all of the tandem process chambers 106 are configured as UV curing chambers, system 100 can be adapted with one or more of the tandem process chambers having supporting chamber hardware as is known to accommodate various other known processes such as chemical vapor deposition (CVD), physical vapor deposition (PVD), etch, and the like. For example, system 100 can be configured with one of tandem process chambers 106 and a CVD chamber for depositing materials, such as a low dielectric constant (K) film, on the substrates. Such a configuration can maximize research and development fabrication utilization and, if desired, eliminate exposure of as-deposited films to atmosphere.

Figure 9:
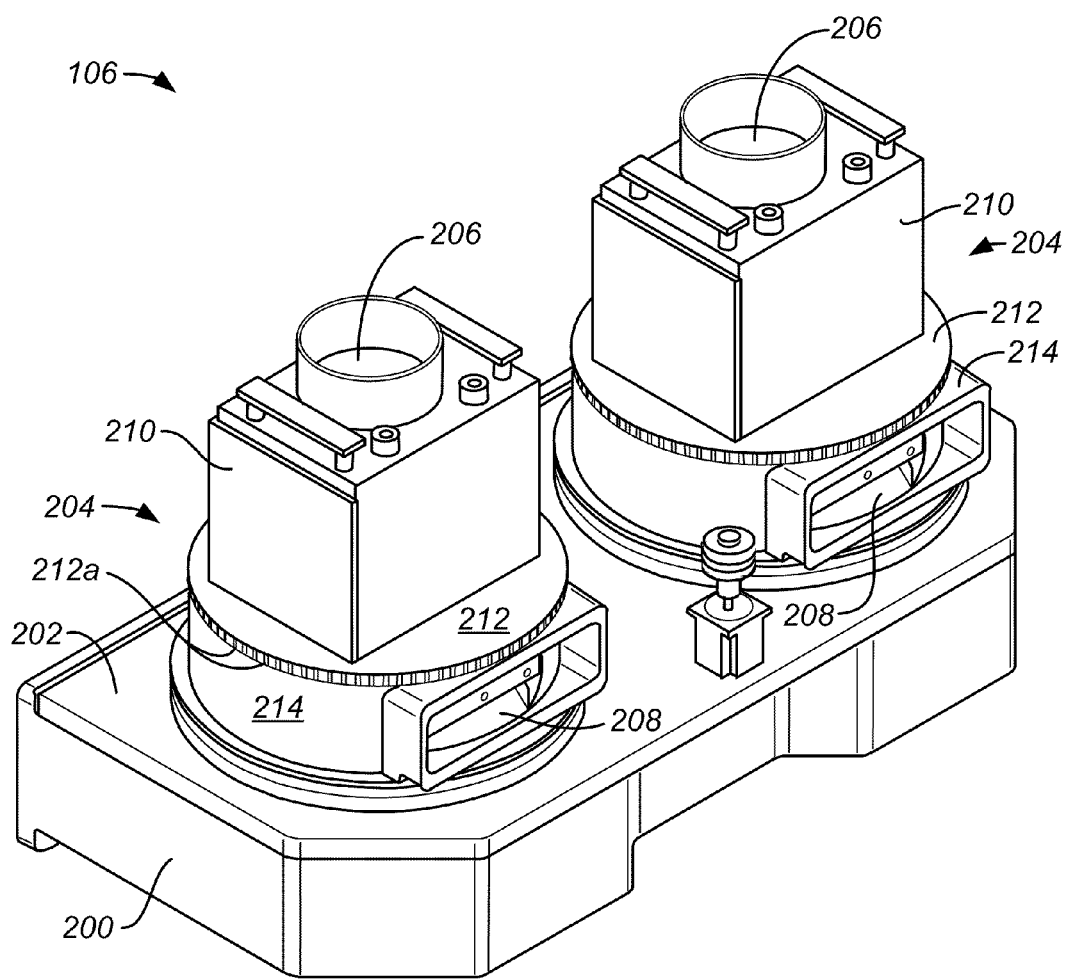
FIG. 9 is a simplified perspective view of a tandem process chamber 106 shown in FIG. 8 configured for UV curing according to one embodiment of the invention.

FIG. 9 is a simplified perspective view of one of tandem process chambers 106 shown in FIG. 8 that is configured for UV curing. Tandem process chamber 106 includes a body 200 and a lid 202 that can be hinged to the body 200. Coupled to the lid 200 are two housings 204 that each include inlets 206 along with outlets 208 for passing cooling air through an interior of the housings 204. The cooling air can be at room temperature or approximately twenty-two degrees Celsius. A central pressurized air source (not shown) provides a sufficient flow rate of air to the inlets 206 to insure proper operation of any UV lamp bulbs and/or associated power sources for the bulbs. Outlets 208 receive exhaust air from the housings 204, which is collected by a common exhaust system (not shown) that can include a scrubber to remove ozone potentially generated by the UV bulbs depending on bulb selection. Ozone management issues can be avoided by cooling the lamps with oxygen-free cooling gas (e.g., nitrogen, argon or helium). Details of a cooling module that can be used in conjunction with tandem process chamber 106 can be found in U.S. application Ser. No. 11/556,642, entitled "Nitrogen Enriched Cooling Air Module for UV Curing System," filed on Nov. 3, 2006 and assigned to Applied Materials, the assignee of the present application. The Ser. No. 11/556, 642 application is hereby incorporated by reference in its entirety.

Each housing 204 includes an upper housing 210 in which a UV lamp, such as lamp 32, is placed and a lower housing 214 in which secondary reflector 40 is placed. Some embodiments of the invention further include a disc 212 having a plurality of teeth 212a that grip a corresponding belt (not shown in FIG. 9) that couples the disc to a spindle 216 which in turn is operatively coupled to a motor (not shown). The combination of discs 212, belts, spindle 216 and motor allow upper housings 210 (and the UV lamps mounted therein) to be rotated relative to a substrate positioned on a substrate support below lid 202.

Figure 10:
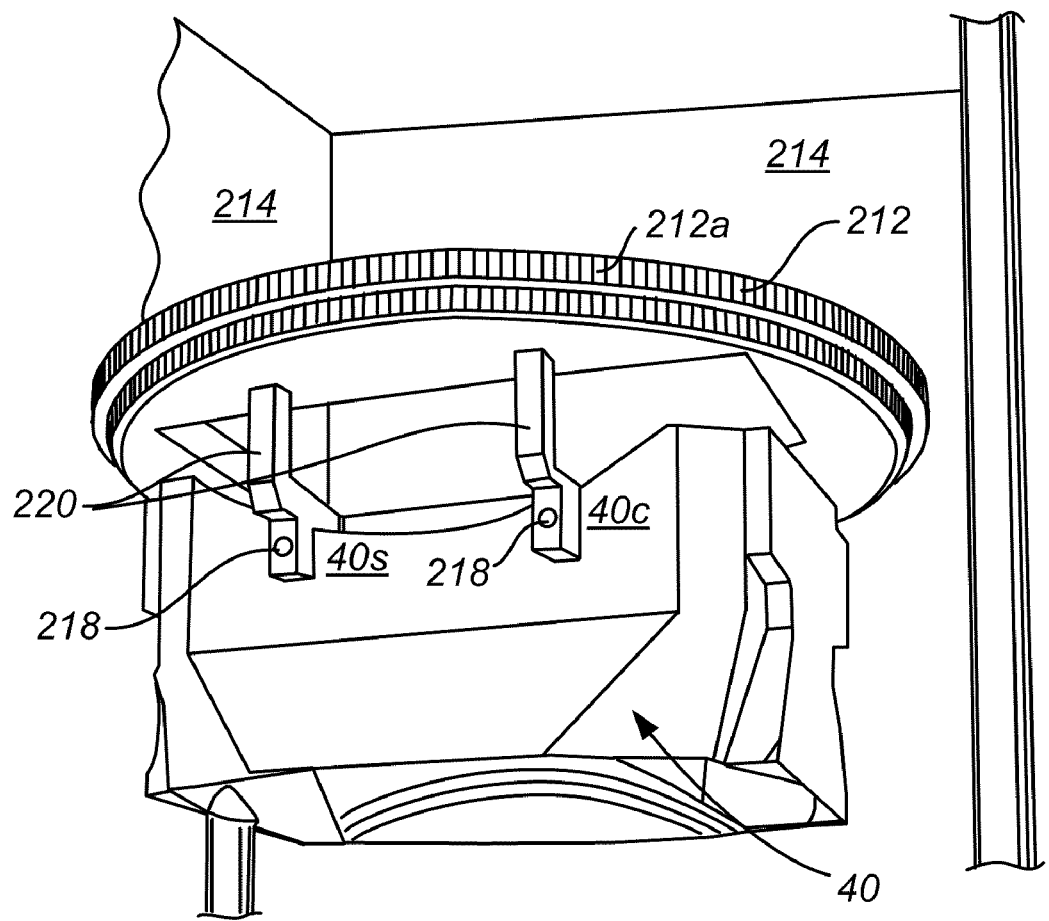
FIG. 10 is a perspective view of secondary reflector 40 attached to a disc 212 that enables the reflector and UV lamp to be rotated with respect to the substrate being exposed to UV radiation according to one embodiment of the invention.

As shown in FIG. 10, which is an upward looking perspective view of a reflector 40 and a disc 212, each secondary reflector 40 is attached to the bottom of respective disc 212 by brackets 220 mounted to the outer surface of parts 40s and 40c via screw holes 218 (also shown in FIG. 2B). This allows secondary reflector to rotate within lower housing 214 along with the upper housing and UV lamps. Rotating the UV lamp relative to the substrate being exposed improves the uniformity of exposure across the surface of the substrate. In one embodiment, the UV lamp can be rotated at least 180 degrees relative to the substrate being exposed. In other embodiments the UV lamp can be rotated 270 degrees, a full 360 degrees or more.

As already described, in some embodiments the primary and secondary reflectors are designed to generate high and low irradiance areas that compensate for each other during rotation thereby providing a uniform radiation pattern. For example, FIG. 11A graphically depicts the irradiance of a UV lamp module 30 according to one embodiment of the invention. In this embodiment, the UV lamp, primary reflector and secondary reflector combine to generate an irradiation pattern that includes areas 66 of relatively higher intensity (about 950-1100 W/m$^2$) and areas 68 of relatively lower intensity (approximately 500-700 W/m$^2$) along opposing ends of the outer periphery of the flood pattern generated by module 30. A large area 67 of relative medium intensity (about 800-900 W/m$^2$) is distributed across most of the area of the substrate being exposed. Higher intensity areas 66 are positioned in substantially the same annular region as lower intensity areas 68 and can be said to be positioned at respective corners of an imaginary square formed within the circular flood pattern.

Figure 11A:
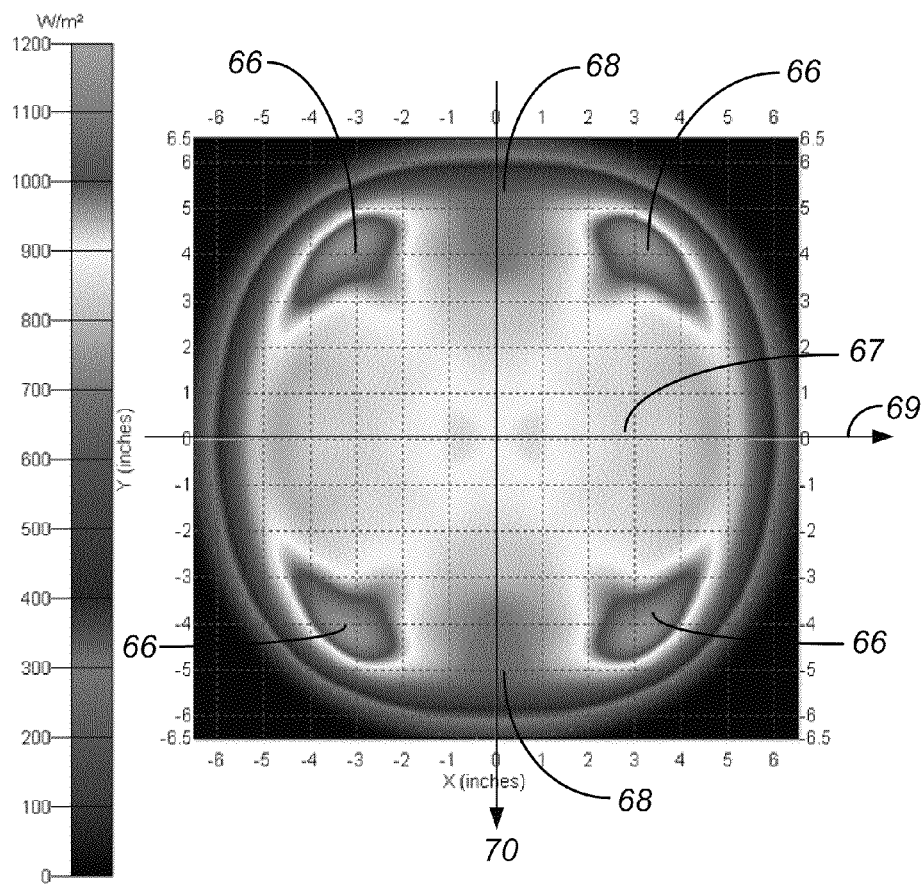
FIG. 11A graphically depicts the irradiance pattern of UV lamp module 30 according to an embodiment of the invention.
Figure 11B:
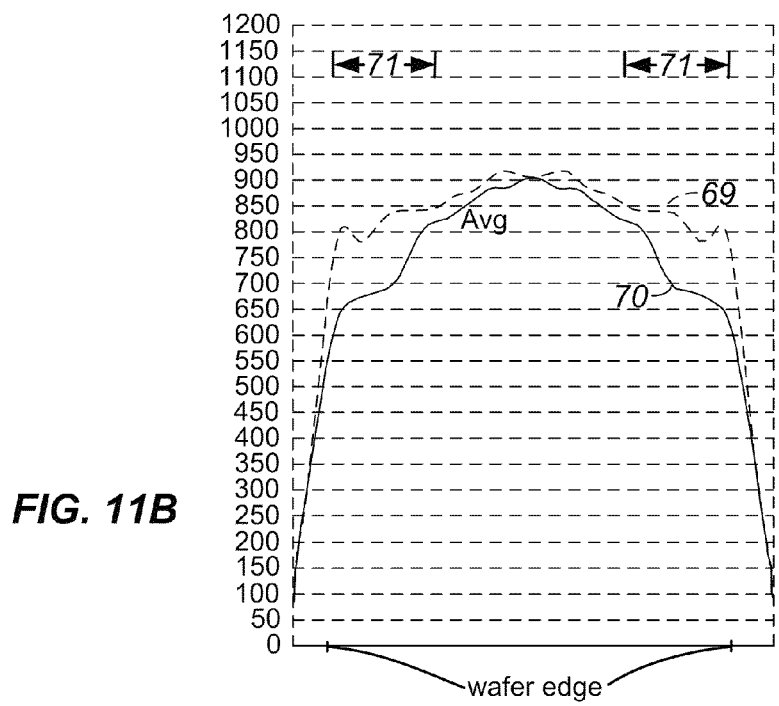
FIG. 11B depicts actual radiation levels shown in FIG. 11A along both axis 69 and axis 70.

FIG. 11B depicts actual radiation levels shown in FIG. 11A along both a horizontal axis 69 and vertical axis 70. FIG. 11B shows the complimentary effect of areas 67 and 68 within annular region 71 and also shows that the variation in irradiance along the different axis in the central region of the substrate is greatly reduced as compared to the variance along the periphery of the substrate.

Figure 11C:
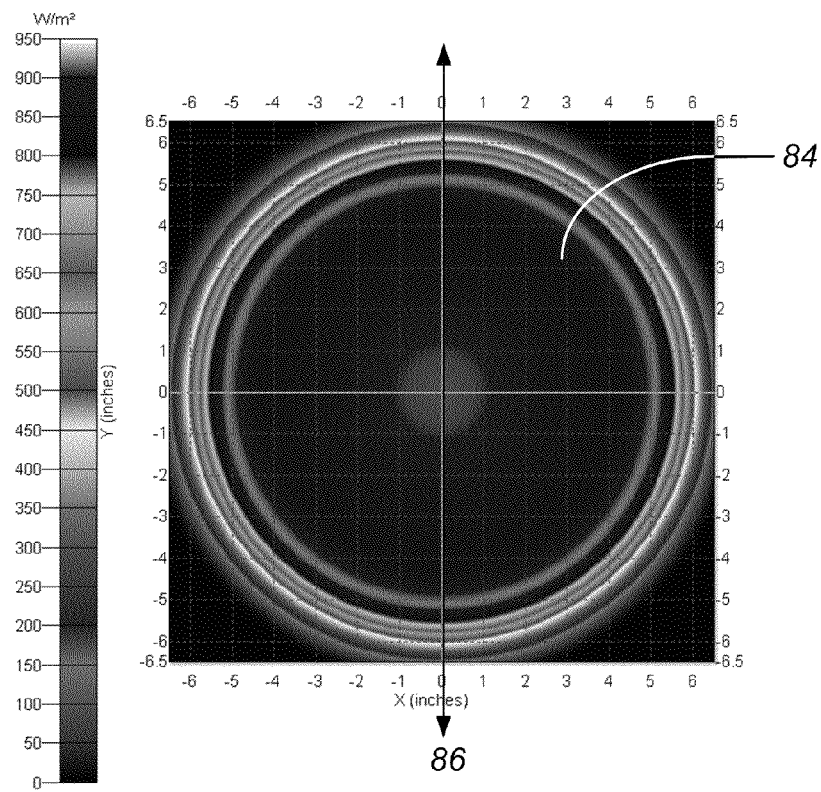
FIG. 11C graphically depicts the irradiance pattern of UV lamp module 30 when rotated during UV exposure according to an embodiment of the invention.
Figure 11D:
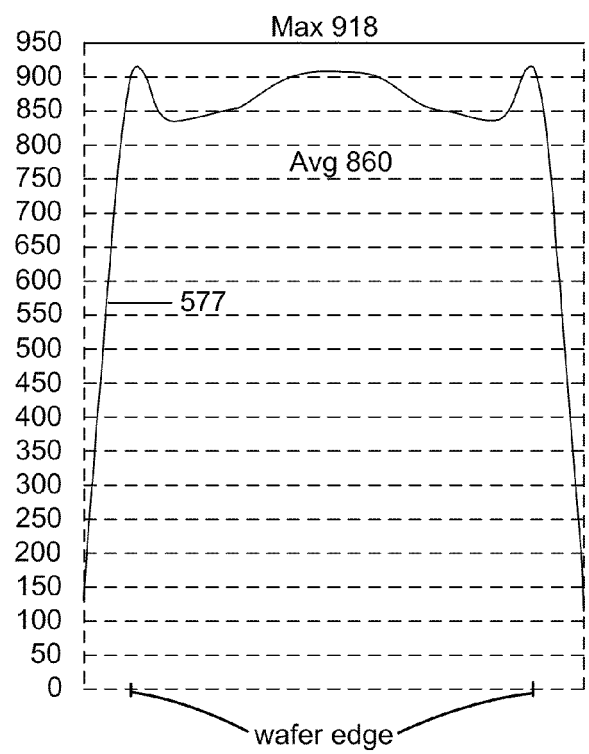
FIG. 11D depicts actual radiation levels shown in FIG. 11C along axis 86.

When UV lamp module 30 is appropriately rotated, the areas of relatively low and high irradiance depicted in FIG. 11A average out close to the medium irradiance level corresponding to area 67 experienced by the majority of a substrate. FIG. 11C graphically depicts the irradiance pattern of FIG. 11A when rotated 180 degrees during UV exposure according to an embodiment of the invention, while FIG. 11D depicts actual radiation levels shown in FIG. 11C along axis 86. The data depicted in FIGS. 11C and 11D was collected after exposing a substrate to UV radiation under the same conditions as done in FIGS. 11A and 11B except that the UV lamp was rotated 180 degrees during the period of exposure measured in FIGS. 11C and 1D. As evident from FIGS. 11C and 11D, rotating the UV lamp during exposure resulted in exposing the substrate to a substantially uniform irradiance level across its entire surface.

A number of different techniques can be used to rotate the UV lamp module relative to the substrate. In some embodiments the UV lamp can be held in a fixed position while the substrate is placed on a substrate support that rotates. In other embodiments the UV lamp can be rotated while the substrate remains stationary and in still other embodiments both the UV lamp and substrate can be rotated, for example in opposite directions.

Figure 12A:
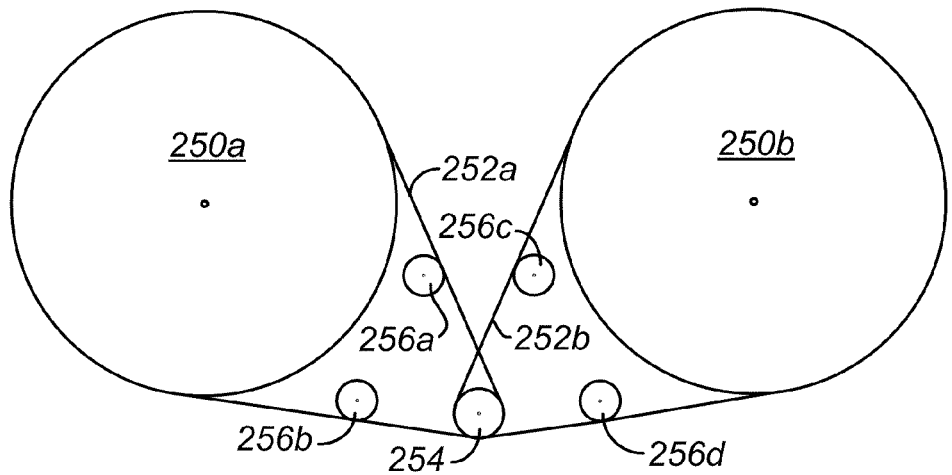
FIGS. 12A-C are simplified top plan drawings depicting drive mechanisms for rotating dual UV lamp modules, such as module 30 shown in FIG. 3, according to various embodiments of the invention.

FIG. 12A depicts one particular embodiment where two discs 250a and 250b are shown that are similar to discs 212 depicted in FIG. 9. Belts 252a and 252b are operatively coupled to each respective disc 250a and 250b and a spindle 254. While not shown in FIG. 12A, belt 252a would be positioned on spindle 254 in a different vertical plan than belt 252b. For example, spindle 254 may include two groves, one above the other, through which each respective belt is run. Similarly, each of discs 250a and 250b may include a grove around its periphery for the belt to run. In other embodiments, discs 250a, 250b and spindle 254 include a plurality of teeth around the outer periphery of each that mate to a plurality of teeth formed on the belts 252a, 252b as shown in FIG. 9. Also shown in FIG. 12A are guides 256a-256d that help maintain proper tension on the belts. The single spindle 254 shown in FIG. 12A allows both discs 25a and 250b to be rotated by the same motor. UV lamps and secondary reflectors can be attached to discs 250a, 250b described with respect to FIG. 10. Note that for ease of illustration discs 250a, 250b are shown as a single solid disc where in actual use in embodiments where the discs are positioned between the UV lamp and substrate the discs will have a window or opening (not shown) that allows UV radiation to pass from through the disc from the UV lamp to the substrate. In embodiments were discs or similar drive mechanisms are located above the UV lamp such windows are not necessary.

Figure 12B:
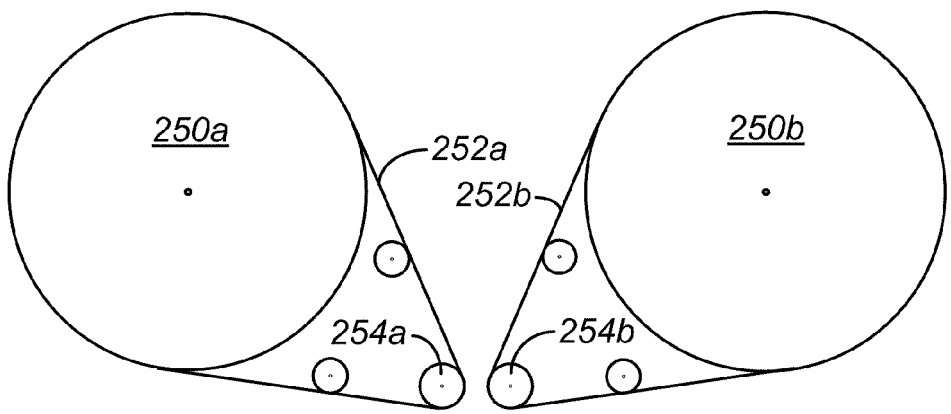
Figure 12C:
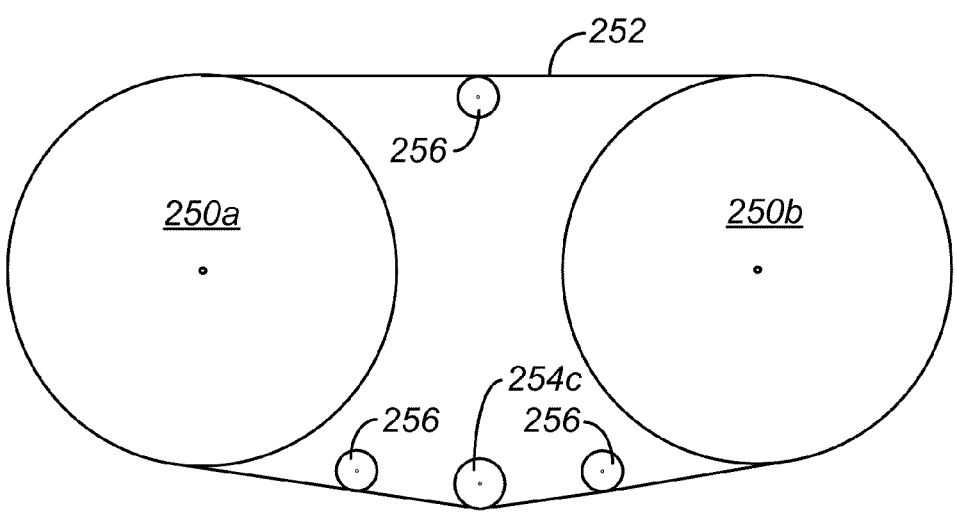

FIG. 12B depicts another arrangement that employs separate spindles 254a and 254b dedicated for the rotation of each of discs 250a, 250b respectively. If each spindle is operatively coupled to a separate motor, this arrangement allows the discs to be rotated independent of each other which may be useful, for example, if process requirements require different curing times or rotational speeds in the chambers served by the UV lamps associated with each of discs 250a, 250b. FIG. 12C depicts still another embodiment where a single belt 252 loops around the periphery of each of discs 250a and 250b driven by a single spindle 254c. While FIGS. 12A-C depict three specific arrangements to effect rotation of the UV lamp relative to the substrate, a person of ordinary skill in the art will recognize that a variety of other arrangements can be employed. Also, a person of skill in the art will appreciate that each of the arrangements illustrated in FIGS. 12A-12C is suitable for rotating UV lamps associated with a tandem process chamber, such as chamber 106 in FIG. 8. Other embodiments of the invention employ motor driven systems that rotate a single UV lamp for a single chamber tool.

Reference is now made to FIG. 13, which is a simplified cross-sectional view (except for the upper portion of the right chamber) of the tandem process chamber 106 illustrated in FIG. 8. FIG. 13 shows a partial section view of tandem process chamber 106 with the lid 202 and housings 204. Each of the housings 204 cover a respective one of two UV lamp bulbs 302 disposed respectively above two process regions 300 defined within the body 200. Each of process regions 300 includes a heated pedestal 306 for supporting a substrate 308 within the process regions 300 during the UV exposure process. Pedestals 306 can be made from ceramic or metal such as aluminum. In one embodiment, the pedestals 306 couple to stems 310 that extend through a bottom of the body 200 and are operated by drive systems 312 to move the pedestals 306 in the processing regions 300 toward and away from UV lamp bulbs 302. In some embodiments the drive systems 312 can rotate and/or translate the pedestals 306 during curing to further enhance uniformity of substrate illumination. Adjustable positioning of the pedestals 306 enables control of volatile cure by-product and purge and clean gas flow patterns and residence times in addition to potential fine tuning of incident UV irradiance levels on the substrate 308 depending on the nature of the light delivery system design considerations such as focal length.

In general, embodiments of the invention contemplate any UV source such as mercury microwave arc lamps, pulsed xenon flash lamps or high-efficiency UV light emitting diode arrays. The UV lamp bulbs 302 are sealed plasma bulbs filled with one or more gases such as xenon (Xe) or mercury (Hg) for excitation by power sources (not shown). Preferably, the power sources are microwave generators that can include one or more magnetrons (not shown) and one or more transformers (not shown) to energize filaments of the magnetrons. In one embodiment having kilowatt microwave (MW) power sources, each of the housings 204 includes an aperture adjacent the power sources to receive up to about 6000 W of microwave power from the power sources to subsequently generate up to about 100 W of UV light from each of the bulbs 302. In another embodiment, the UV lamp bulbs 302 can include an electrode or filament therein such that the power sources represent circuitry and/or current supplies, such as direct current (DC) or pulsed DC, to the electrode.

The power sources for some embodiments can include radio frequency (RF) energy sources that are capable of excitation of the gases within the UV lamp bulbs 302. The configuration of the RF excitation in the bulb can be capacitive or inductive. An inductively coupled plasma (ICP) bulb can be used to efficiently increase bulb brilliancy by generation of denser plasma than with the capacitively coupled discharge. In addition, the ICP lamp eliminates degradation of UV output due to electrode degradation resulting in a longer-life bulb for enhanced system productivity. Benefits of the power sources being RF energy sources include an increase in efficiency.

Preferably, the bulbs 302 emit light across a broad band of wavelengths from 180 nm to 400 nm. The gases selected for use within the bulbs 302 can determine the wavelengths emitted. Since shorter wavelengths tend to generate ozone when oxygen is present, UV light emitted by the bulbs 302 in some embodiments is tuned to predominantly generate broadband UV light above 200 nm to avoid ozone generation during cure processes.

UV light emitted from the UV lamp bulbs 302 enters the processing regions 300 by passing through windows 314 disposed in apertures in the lid 202. In one embodiment the windows 314 are made of an OH free synthetic quartz glass and have sufficient thickness to maintain vacuum without cracking. Further in one embodiment, the windows 314 are fused silica that transmits UV light down the approximately 150 nm. Since the lid 202 seals to the body 200 and the windows 314 are sealed to the lid 202, the processing regions 300 provide volumes capable of maintaining pressures from approximately 1 Torr to approximately 650 Torr. Processing or cleaning gases enter the process regions 300 via a respective one of two inlet passages 316. The processing or cleaning gases then exit the process regions 300 via a common outlet port 318. Additionally, the cooling air supplied to the interior of the housings 204 circulates past the bulbs 302, but is isolated from the process regions 300 by the windows 314.

During UV curing it is common for water molecules and various other species to be outgassed or otherwise released from the film or material being cured or processed. These species tend to collect on various exposed surfaces of the chamber, such as windows 314, and can reduce the efficiency of the process. To reduce the build-up of these species and maintain a high efficiency process, periodic cleaning of the surfaces, such as after every 200 wafers, may be employed as described below. Also, a laminar flow of a purge gas, such as argon or another noble or inert gas or other suitable gas, may be provided across the irradiated surface of the substrate being treated to carry outgassed species out of the chamber. The laminar flow may emanate from a pump liner (not shown) operatively coupled to inlet and outlet ports 316, 318. Details of a processing region 300 having such a pump liner are in U.S. application Ser. No. 11/562,043, entitled "Increased Tool Utilization/Reduction in MWBC for UV Curing Chamber,", filed on Nov. 21, 2006 and assigned to Applied Materials, Inc., the assignee of the present application. The Ser. No. 11/562,043 application is hereby incorporated by reference in its entirety.

UV lamp bulbs 302 can also be activated during chamber clean processes to increase the efficiency of the chamber clean. As an example clean process, the temperature of the pedestals 306 can be raised to between about 100° C. and about 600° C., preferably about 400° C. With the UV pressure in the processing regions 300 elevated by the introduction of the cleaning gas into the region through the inlet passages 316, this higher pressure facilitates heat transfer and enhances the cleaning operation. Additionally, ozone generated remotely using methods such as dielectric barrier/corona discharge or UV activation can be introduced into the processing regions 300. The ozone dissociates into $O^-$ and $O_2$ upon contact with the pedestals 306 that are heated. In the clean process, elemental oxygen reacts with hydrocarbons and carbon species that are present on the surfaces of the processing regions 300 to form carbon monoxide and carbon dioxide that can be pumped out or exhausted through the outlet port 318. Heating the pedestals 306 while controlling the pedestal spacing, clean gas flow rate, and pressure enhances the reaction rate between elemental oxygen and the contaminants. The resultant volatile reactants and contaminants are pumped out of the processing regions 300 to complete the clean process.

Figure 14:
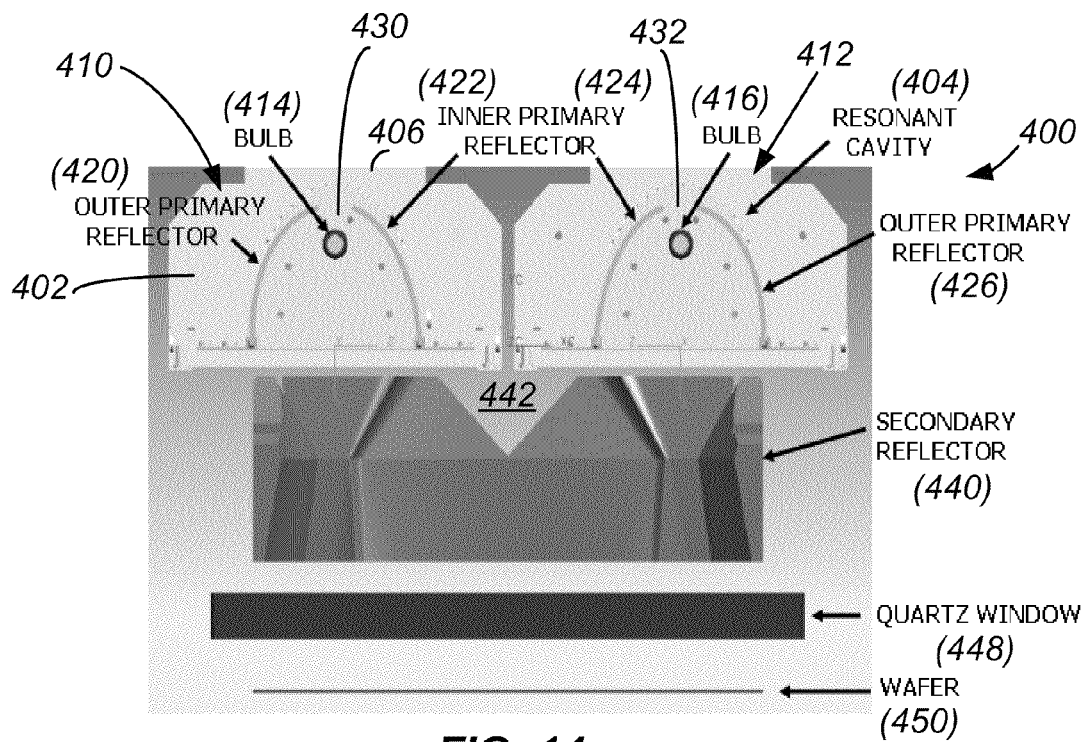
FIG. 14 is a simplified cross-sectional view of a dual lamp chamber according to one embodiment of the present invention.

In order to increase the irradiation generated by the UV lamp (e.g., UV lamp module 30) and thus allow for shorter exposure times and higher wafer throughput, some embodiments of the invention employ multiple UV lamps for each single wafer processing region. FIG. 14 is a simplified cross-sectional view of a two UV source, single wafer UV cure chamber 400 according to one embodiment of the invention. In FIG. 14, two cylindrical high power mercury microwave lamps 410 and 412 are positioned parallel to each other within respective resonant cavities 402 and 404. Lamp 410 includes an elongated UV bulb 414 partially surrounded by a non-focal elliptical primary reflector having an outer reflector 420 and inner reflector 422. Lamp 412 includes an elongated UV bulb 416 partially surrounded by a non-focal elliptical primary reflector having an inner reflector 424 and an outer reflector 426. Slits 430 and 432 between the inner and outer primary reflectors of each lamp 410, 412 allow for lamp cooling air introduced through inlets 406 to flow across bulbs 414 and 416.

Figure 15:
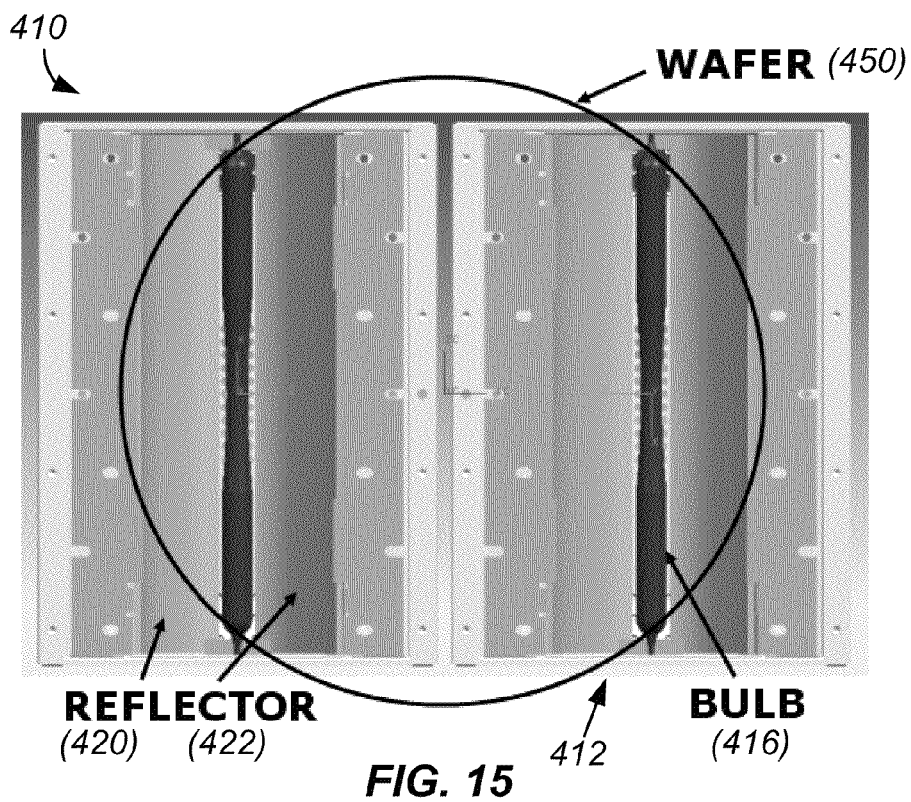
FIG. 15 is a bottom plan view of lamps 410 and 412 depicted in FIG. 14.

An aluminum secondary reflector 440 is positioned between lamps 410, 412 and a quartz window 448 on the atmospheric side of the window. A substrate 450 is located on a vacuum side of quartz window 448 and positioned on a heated substrate support (not shown) within a processing region such as region 300 within a pressure controlled chamber as described with respect to FIG. 13. Substrate 448 can be located about 5-20 inches away (6-11 inches away in another embodiment) from lamps 410, 412. An opening 442 on the upper portion of the secondary reflector allows lamp cooling air to exit with minimum conductance loses. All of the primary and secondary reflectors have a dichroic coating on their reflective surfaces to ensure maximum reflectivity in the 180-400 nm range. As shown in FIG. 15 in this particular two lamp configuration, the housing associated with lamps 410 and 412 extends beyond the outline of substrate 450.

Figure 16:
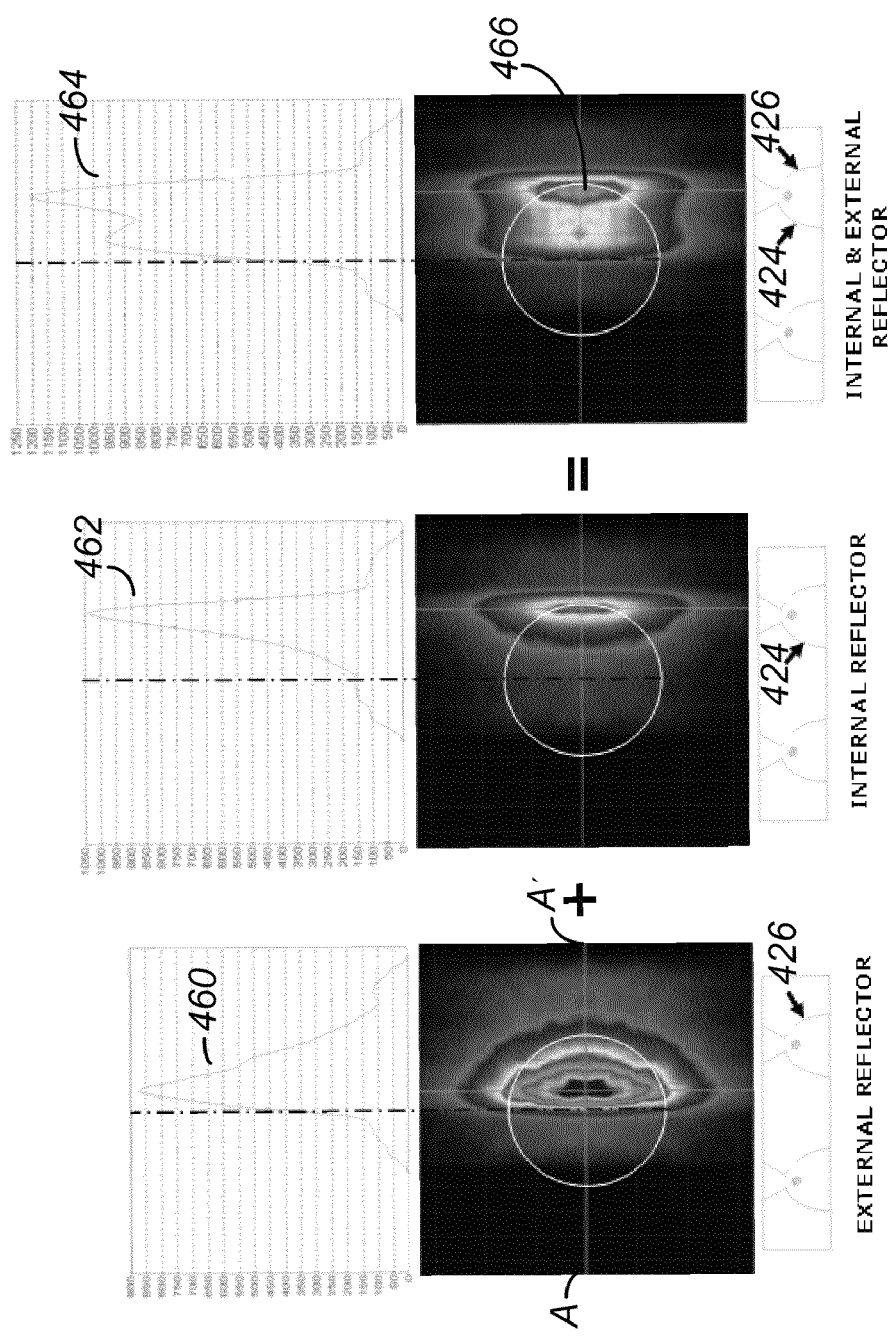
FIGS. 16-18 graphically depict the irradiance pattern of portions of UV cure system 400 depicted in FIG. 14.

Each lamp, with its associated primary reflectors, delivers UV radiation to approximately one half of the wafer. The direct radiation (non-reflected) that contacts the substrate has a higher intensity near the center of the wafer than at the wafer's edge. In order to compensate for this, light reflected from the reflectors is focused on the edge of the wafer. To this end, the inner and outer primary reflectors of each of lamps 410 and 412 have different curvatures such that the primary reflectors of each lamp produce an asymmetric irradiance profile in which the lowest irradiance is in the center of the wafer and the highest irradiance is at the edge of the wafer (in this embodiment outer reflectors 420 and 426 are symmetric to each other as are inner reflectors 422 and 424). FIG. 16 shows the irradiance pattern of the inner and outer primary reflectors 424, 426 for UV lamp 412. As shown in FIG. 16, outer primary reflector 426 produces irradiance profile 460 having an area of highest intensity towards the center of the substrate while inner primary reflector 424 produces irradiance profile 462 having an area of highest intensity along the periphery of the substrate. Irradiance profiles 460 and 462 combine to produce a combined irradiance profile 464 that covers approximately one half of substrate 450 and has an area 466 of highest intensity along the periphery of the substrate. Each of profiles 460, 462 and 464 is taken along diameter A-A' shown in FIG. 16.

Figure 17:
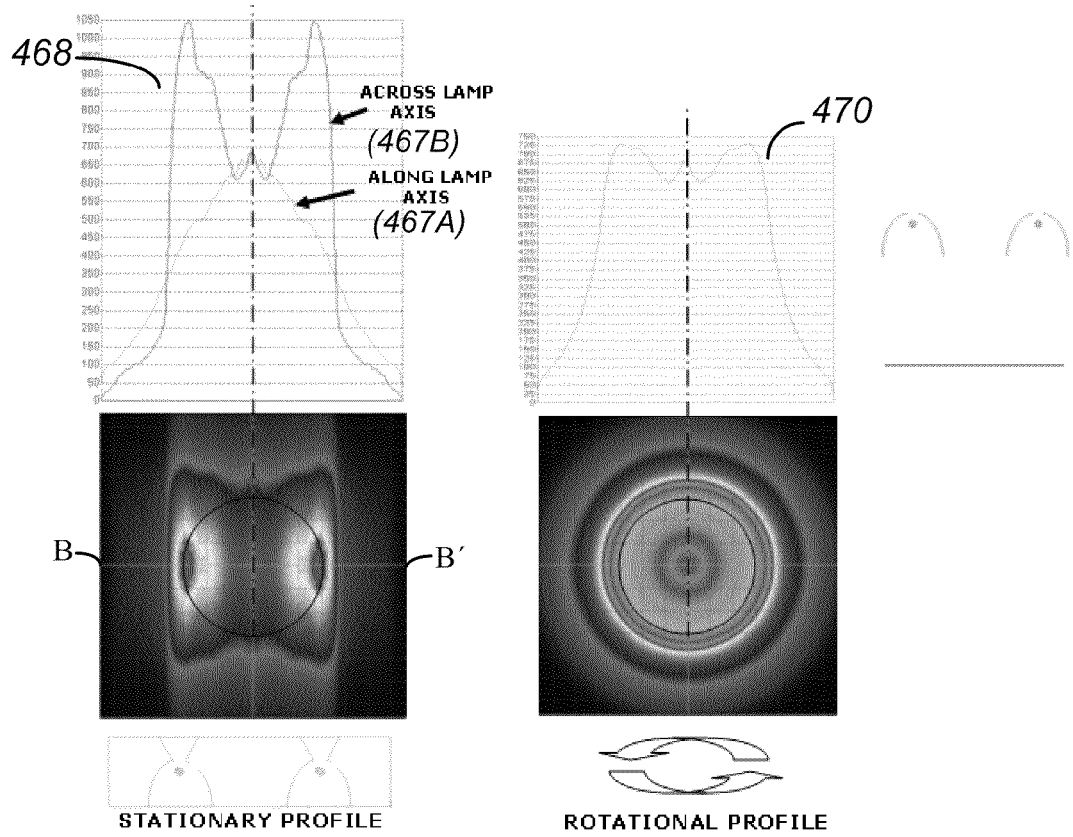

FIG. 17 shows the irradiance profile produced by lamp 410 combined with lamp 412 (including bulbs 414, 416 and primary reflectors 420, 422, 424 and 426). As shown in FIG. 17, the lamps produce a convex irradiance profile 467A along the lamp axis and a concave irradiance profile 467B across the lamp axis. The curvature of the primary reflectors is such that static irradiance profile 468 (profiles 467A and 467B combined) has a "Batman" shape as viewed along and across lamp axis B-B'. Once rotated, however, the complimentary areas of high intensity and low intensity combine to generate a significantly more uniform profile as shown by 470.

Figure 18:
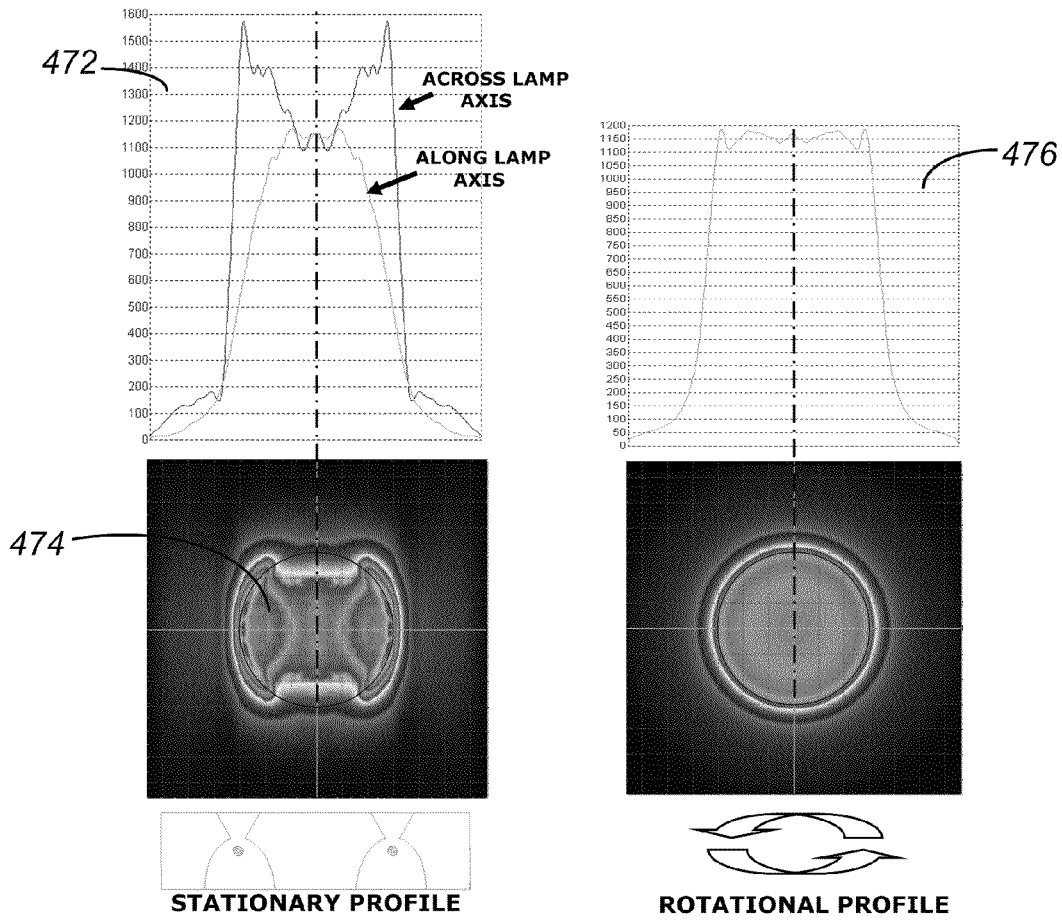

Without any reflectors, approximately 15% of direct light emitted by the two mercury lamps would reach the surface of substrate 450. The irradiance profile of the direct light is a center high dome. The primary reflectors (420,422) and (424, 426) approximately triple the amount of light reaching the substrate. As evident from an analysis of FIGS. 17 and 18, secondary reflector 440 increases the irradiance by about an additional 35% by redirecting the light that would otherwise fall outside the substrate back to the substrate surface. Specific curvature of the reflective surface of the secondary reflector allows further correction to irradiance profile as described above. This technique is especially useful in achieving a flat irradiance profile at the edge of the wafer without excessive losses to light irradiance. FIG. 18 shows the affect the addition of secondary reflector 440 has to the irradiance profile generated by just the lamps and primary reflectors. As shown in FIG. 18, irradiance profile 472 has a similar "batman" shape as profile 468 but at a significantly higher intensity level. Furthermore, secondary reflector 440 enables irradiance pattern 474 to be generated such that, when rotated, irradiance profile 476 is even more uniform than profile 470.

In one particular embodiment of the invention, lamps 410 and 412 are linear lamps inside a rectangular footprint that deliver light to a 12" wafer with minimum losses and light irradiance non-uniformity below 3%. The optical system (lamp, primary and secondary reflectors) of cure chamber 400 are designed to take full advantage of lamp rotation. As shown in FIG. 18, the lamps and reflectors combine to generate a concave irradiance profile across the lamps and a convex irradiance profile along the lamps. Then, after rotation high and low irradiance areas compensate each other producing relatively flat profile. Each lamp produces an asymmetric profile because each lamp covers approximately half of the wafer, therefore the internal primary reflector and external primary reflector of each lamp have a different shape. Also, the primary reflectors have a non-focused elliptical curvature, without local extremities, which makes them less sensitive to manufacturing accuracy and alignment accuracy.

The second component of the optical system is a secondary reflector 440. Secondary aluminum reflector (440) serves two functions. First, it increases the average irradiance on the wafer (in one specific embodiment by about 35%) by reducing the light falling outside the wafer. Second, the secondary reflector allows further improvement to irradiance uniformity across wafer. In some embodiments a final correction to irradiance profile (correction based on actual film shrinkage map) can also be done by shape modification of the secondary reflector. Both primary and secondary reflectors have dichroic coating to allow at least 90% reflectance in the 200 nm-400 nm range.

As shown in Table 1 below, tests run by the inventors demonstrate that embodiments of the invention that use the two lamp rotational technique depicted in FIG. 14 allowed a reduction in cure time for a low-k film from 25 minutes, for stationary single lamp, to 9 minutes with the same average film shrinkage and significantly improved film shrinkage uniformity.

TABLE 1

|  | Unit | Stationary | Single Rotating | Dual Rotating |
| --- | --- | --- | --- | --- |
| Lamp Distance from Wafer | inch | 10.66" | 10.8" | 8.8" |
| Lamp Power | W | 90 W | 90 W | 90 W + 90 W |
| Irradiance: Average on Wafer[1] | $W/m^2$ | 368 | 616 | 1023 |
| Irradiance: Unformity[1] | % | 9.6 | 5.4 | 2.6 |
| Irradiance: Range[1] | % | +/−20 | +/−14 | +/−8 |
| UV Treatment Time[2] | min | 25 | 15 | 9 |
| Film Shrinkage Non-uniformity[2] | % | 5.6 | 4.3 | 3.0 |

[1]simulated result
[2]measured result

Figure 19:
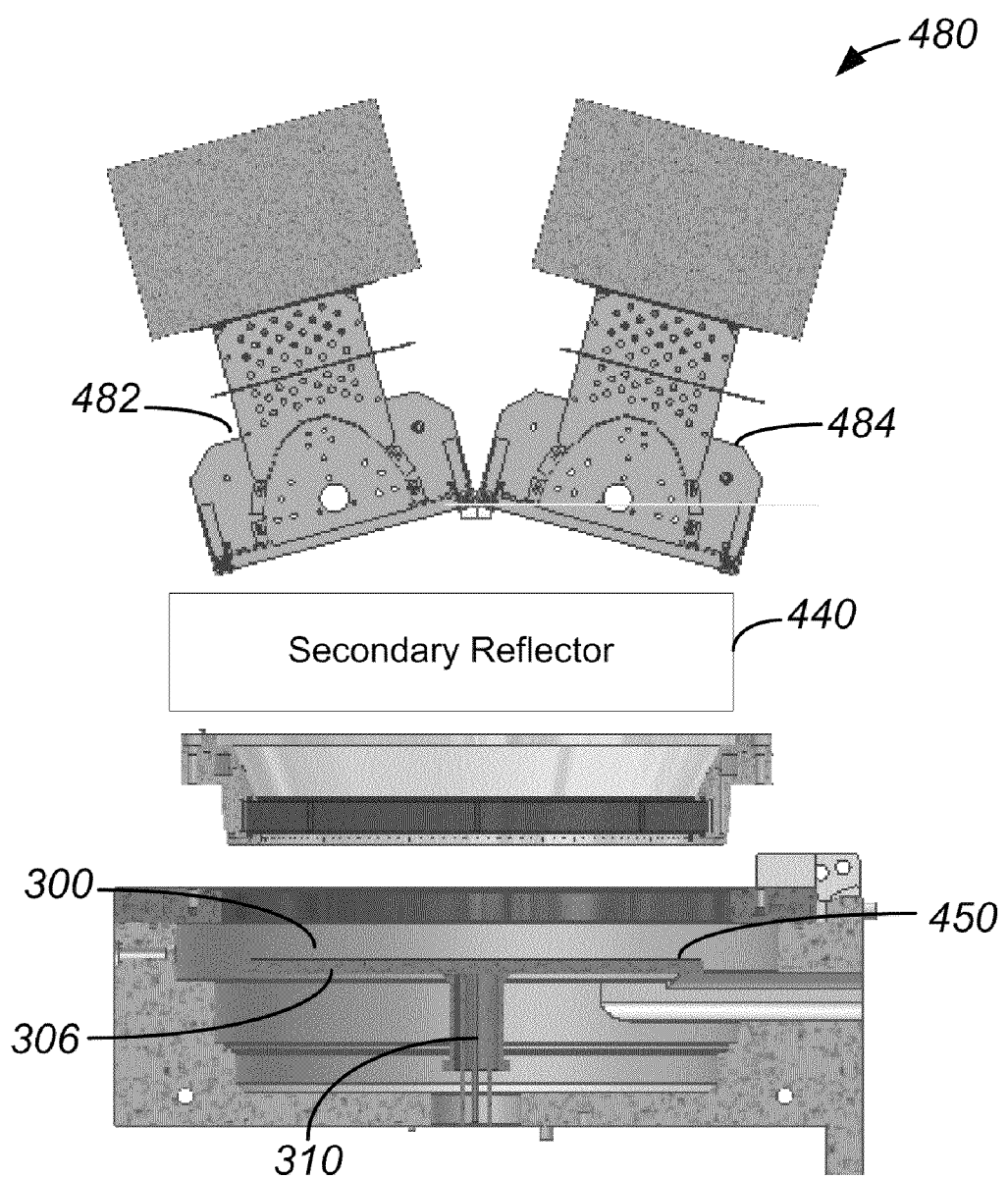
FIG. 19 is a simplified cross-sectional view of a dual lamp chamber according to another embodiment of the present invention.

FIG. 19 is a simplified cross-sectional view of another embodiment of a dual lamp system 480 according to the present invention. System 480 is similar to system 400 shown in FIG. 14 except that first and second UV lamps 482, 484 are mounted at opposing angles to each other in order to allow the lamps to be positioned closer to the center of the substrate being treated and allow more room for cooling air to flow through the lamps. In some embodiments, the opposing angles are between 2-25 degrees relative to vertical and between 4-10 degrees in other embodiments. Other configurations of lamps can be used in additional embodiments of the invention. In system 480 shown in FIG. 19, the design of the primary and secondary reflectors can be tailored using the techniques described above to compensate for the angle of lamps 482 and 484 to produce a desired irradiance pattern.

The efficiency of UV lamps, such as lamps 410, 412, deteriorate over time. Some embodiments of the invention include irradiance sensors that allow the intensity/reflectivity of each component of the UV lamp to be monitored separately in order to determine a replacement schedule and attain high light uniformity over the lifetime of the lamp. To achieve this function, one embodiment of the invention includes a plurality of holes or slots (sometimes referred to herein as light pipes) created through the secondary reflector. Radiation passing through each light pipe contacts a UV radiation sensor that measures the intensity of radiation in a selected wavelength range (e.g., 200-400 nm or a narrower range such as 250-260 nm, 280-320 nm, 320-390 nm or 395-445 nm) passing through the light pipe.

The location and direction of the light pipe, its diameter and its length determine which individual light rays generated from a lamp make it through the light pipe to reach the sensor (i.e., the acceptance angle of the light pipe). Each light pipe is designed to for a specific acceptance angle that allows one lamp component (e.g., one lamp bulb or one primary reflector) to be monitored independent of the other components. Generally, the axis of the light pipe is coincident with the angle rays that are intended to pass through the pipe. This way only light generated by or reflected from the desired component passes through the light pipe to the sensor. A light pipe may thus be considered a directional filter that allows only rays from a particular direction to be passed through the filter.

Depending on the thickness of the secondary reflector in the region an individual light pipe is formed, the length of the light pipe may be extended by inserting a tube (e.g., an aluminum tube) into the hole or slot formed through the secondary reflector. To reduce the effects of reflectance within the light pipe and ensure that only radiation rays within the particular angle of acceptance a light pipe is designed for reach its sensor, the interior surfaces of a light pipe may be lined or coated with an appropriate light absorbing material that absorbs radiation in the wavelengths for which the sensor detects. Alternatively, the interior surface of a light pipe may be treated to have a high roughened (e.g., by scrubbing with a steel brush) to dissipate, via multiple reflections, unwanted light that contacts the wall of the light pipe.

In monitoring an individual component of a UV lamp, it is desirable that the light pipe allow only rays generated by or reflected by that component to reach the sensor at the end of the light pipe that monitors the component. In some instances it may not be practical to design the light pipe such that 100% of the rays reaching its associated sensor are from a single component and instead the light pipe is designed so that a suitably high percentage, e.g., 80% or 90%, of the rays that reach its sensor are from the monitored component.

For the UV cure system of FIG. 14, six different light pipes can be included to separately monitor each of UV bulbs 414 and 416 as well as each of the primary reflectors 420, 422, 424 and 426. Direct rays and reflected rays travel at different angles. Similarly, reflected rays from each of the primary reflectors 420, 422, 424 and 426 land on different spots of the secondary reflector. Using this knowledge and an appropriate ray tracing program, a location of each light pipe through the secondary reflector can be determined that allows each light pipe to monitor one of components.

Figure 20:
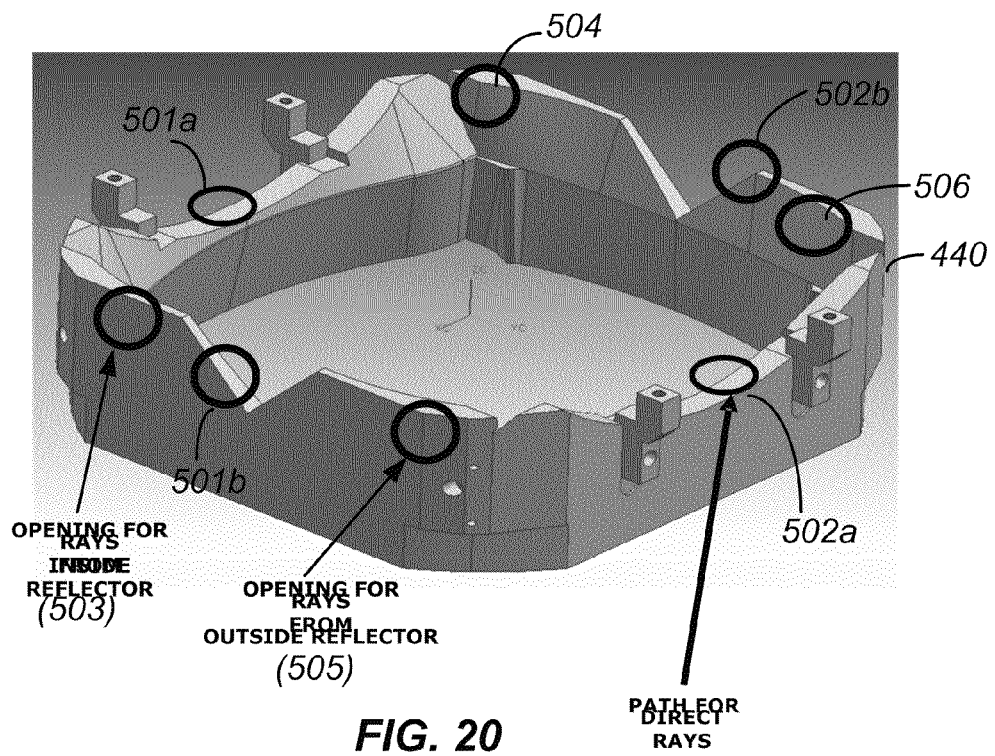
FIG. 20 is a simplified perspective view of secondary reflector 440 shown in FIG. 14 that illustrates a possible location for light pipes that independently monitor each of the UV bulbs and primary reflectors of UV cure system 400 according to one embodiment.
Figure 21:
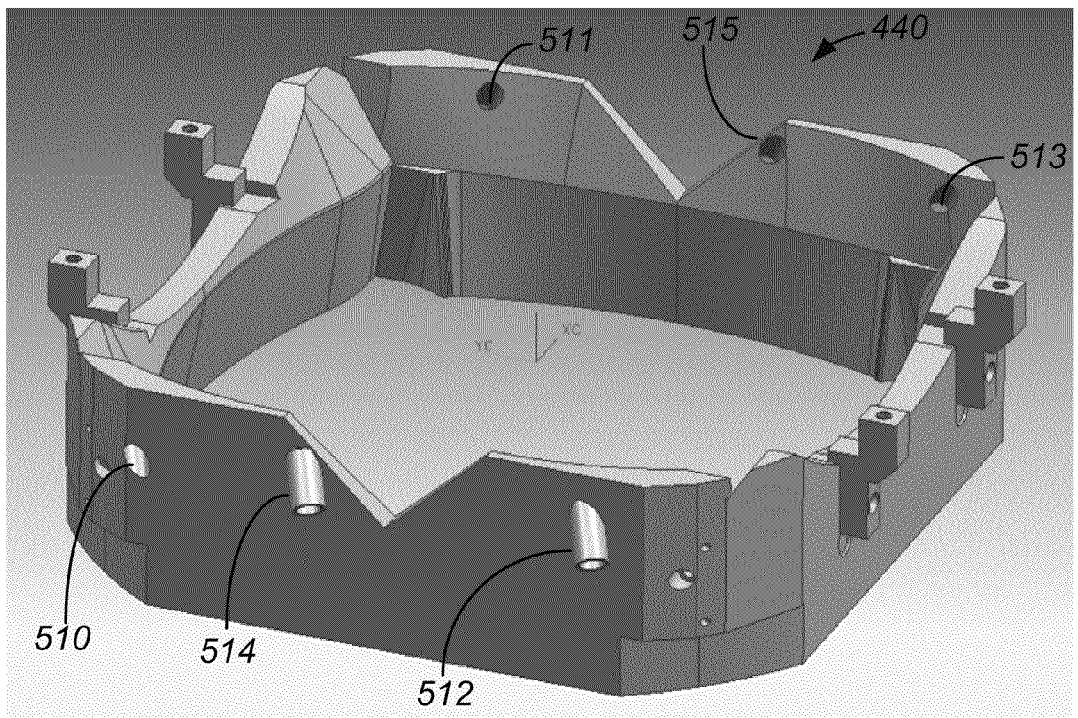
FIG. 21 is a simplified perspective view of secondary reflector 440 including light pipes to independently monitor each of the primary reflectors and UV bulbs of UV cure system 400 according to one embodiment.

Reference is now made to FIGS. 20 and 21 which are perspective views of secondary reflector 440 previously shown in FIG. 14 prior to and subsequent to the incorporation of light pipes in the secondary reflector. FIG. 20 shows locations 501-506 in secondary reflector 440 at which the six light pipes to monitor the separate components (bulbs 414, 416 and primary reflectors 420, 422, 424, 426) can be positioned. Locations 501A and 502A are on opposing ends of the secondary reflector and are well suited for light pipes that are designed to filter out all or most of the radiation reflected from the primary reflectors thereby allowing only direct radiation from one of bulbs 414 or 416 to pass through. When the UV lamp 410 is positioned over the left hand portion of secondary reflector 440 as it is laid out in FIG. 20 and UV lamp 412 is positioned over the right hand side of the secondary reflector, a light pipe to monitor direct radiation generated by UV bulb 414 can be placed at location 501A and a light pipe to monitor direct radiation by UV bulb 416 can be placed at location 502A. Locations 501B and 502B are alternative locations at which light pipes may be placed to monitor UV bulbs 414 and 416, respectively. Additionally, a light pipe to monitor radiation reflected by outer primary reflector 420 can be place at location 503, a light pipe to measure radiation reflected by inner primary reflector 422 can be place at location 504, a light pipe to monitor radiation reflected by inner primary reflector 424 can be place at location 505 and a light pipe to measure radiation reflected by outer primary reflector 426 can be place at location 506.

FIG. 21 shows light pipes 510-513 that have been incorporated into secondary reflector 440 at locations 503-506, respectively and light pipes 514 and 515 formed at locations 501*b* and 502*b*, respectively. Light pipe 510 monitors the reflectance of outer primary reflector 420, pipe 511 monitors the reflectance of inner primary reflector 422, pipe 512 monitors the reflectance of inner primary reflector 424 and pipe 513 monitors the reflectance of outer primary reflector 426. Light pipes 510 and 513 are formed from openings through the reflective surface of the secondary reflector in locations 503 and 506, respectively. Light pipes 511 and 512 are formed from openings through the reflective surface of the secondary reflector in locations 504 and 505 respectively. Additionally, an extension tube is fitted to each of the holes in locations 504 and 505 to lengthen each light pipe 511 and 512 to further filter out radiation that is not associated with the reflector each pipe is associated with. Light pipes 514 and 515, which are also fitted with extension tubes, monitor the intensity of UV bulbs 414 and 416, respectively.

Some embodiments of the invention include a separate UV radiation sensor at the end of each light pipe. Embodiments of the invention that rotate one or more of the UV lamp or substrate during the cure process, however, may use fewer than one sensor per light pipe. For example, in an embodiment where the lamp module is rotated 180 degrees during the UV cure process, two UV radiation sensors can be used. A first sensor may be positioned, for example, to detect radiation passing through light pipes 510, 514 and 512 while a second sensor may be positioned to detect radiation passing through light pipes 511, 515, 513. In another example, a single sensor may be used to detect radiation passing through each of light pipes 510-515 providing the lamp module is rotated a sufficient amount (e.g., 270 or 360 degrees) to allow light passing through each of the light pipes to contact the sensor during the cure process. Where individual sensors monitor multiple light pipes, logic or control circuitry (e.g., a microcontroller or computer processor) tracks the timing of the rotations and the data samples from the sensor and uses the timing information and the known rotational pattern to determine which light pipe individual sensor readings are associated with.

Figure 22A:
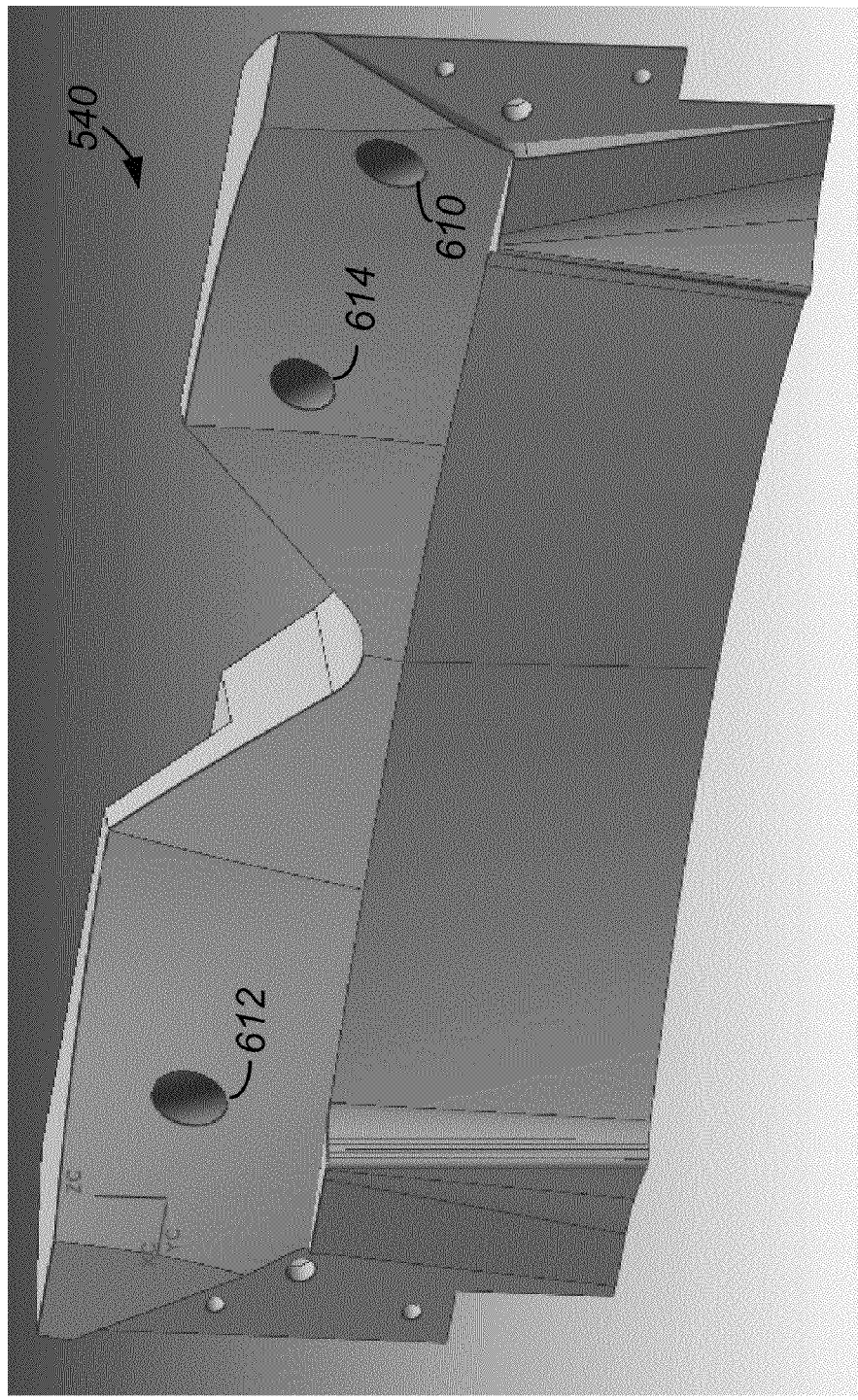
FIGS. 22A and 22B are simplified perspective views of a portion of a secondary reflector according to another embodiment of the present invention.
Figure 22B:
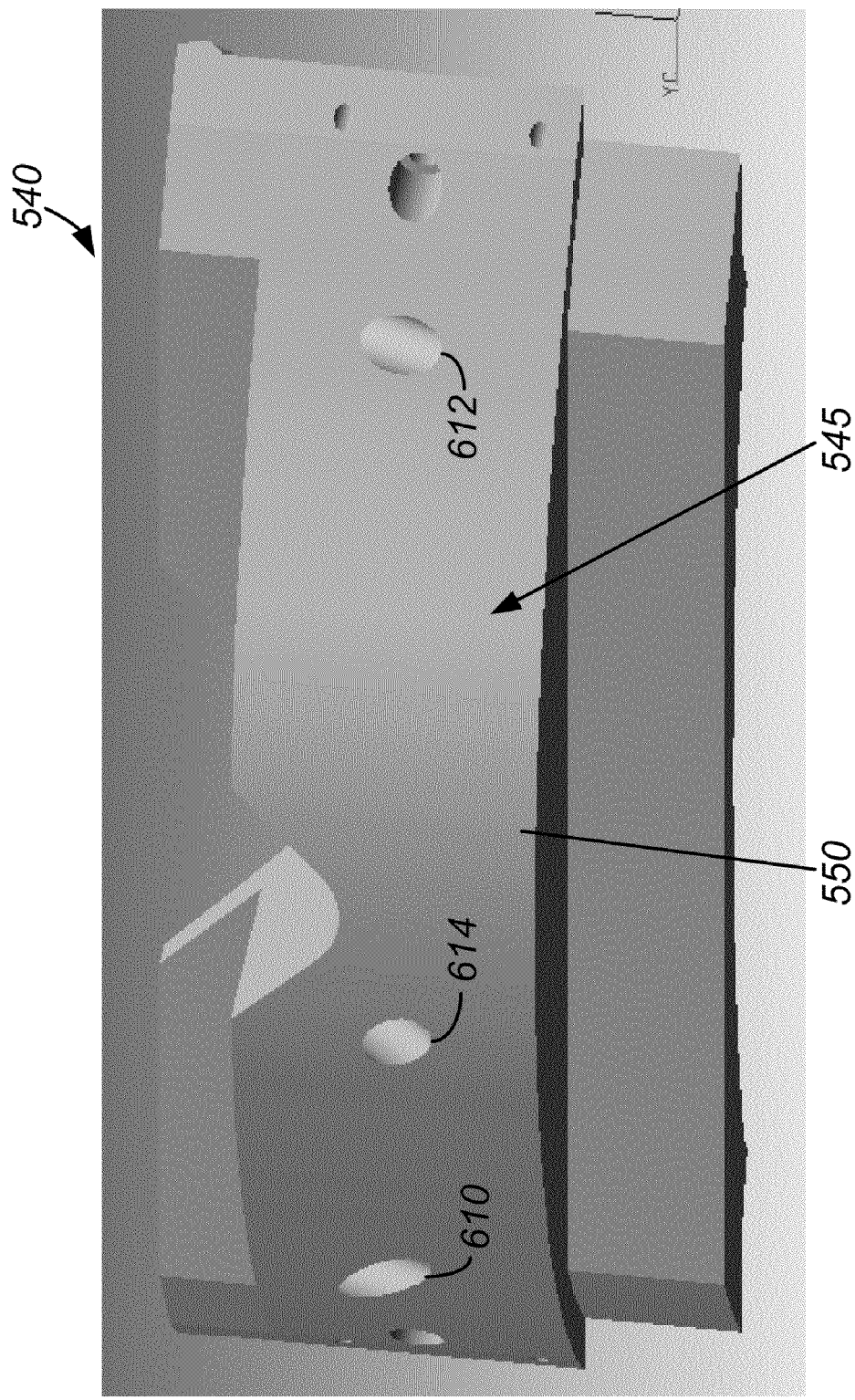

In order to reduce noise detected by a UV radiation sensor, it is desirable that the sensor be placed as close a possible to the exit of the light pipes. In an embodiment where a single sensor is used to detect UV radiation emitted through multiple light pipes, this may require extending the length of certain light pipes relative to others to ensure that all light pipes operatively positioned to work with a particular sensor have a similar distance between the end of the light pipe and the sensor. As an example, reference is made to FIGS. 22A and 22B, which are perspective views of one side of a reflector 540 according to one embodiment of the invention. Reflector 540 includes light pipes 610, 612 and 614 formed in regions of the reflector comparable to the regions at which light pipes 510, 512 and 514 are formed in reflector 440. Reflector 540 is notably thicker than reflector 440, however, in an outer peripheral region 545 of the reflector. Region 545 includes a curved surface 550 that has a curvature radius selected so that the end of each of light pipes 510, 512 and 514 is equally spaced to a sensor (not shown) that is operatively positioned to detect UV radiation passing through each of the holes as secondary reflector 540 is rotated.

Having fully described several embodiments of the present invention, many other equivalent or alternative apparatuses and methods of curing dielectric films according to the present invention will be apparent to those skilled in the art. These alternatives and equivalents are intended to be included within the scope of the present invention.

What is claimed is:

1. A method of curing a layer of dielectric material formed over a substrate, the method comprising:
    placing the substrate having the dielectric material formed thereon on a substrate support in a substrate processing chamber;
    exposing the substrate to ultraviolet radiation from a source of ultraviolet radiation that is spaced apart from the substrate support while rotating either the ultraviolet radiation source and/or substrate at least 180 degrees relative to each other during the exposing step.

2. The method of curing a layer of dielectric material set forth in claim 1 wherein the exposing step comprises rotating the ultraviolet radiation source at least 180 degrees.

3. The method of curing a layer of dielectric material set forth in claim 1 wherein exposing the step generates a substantially circular flood pattern having complementary high and low intensity areas which combine to generate a substantially uniform irradiance pattern during rotation during the exposing step that compensate for each other during rotation thereby providing a substantially uniform radiation pattern.

4. The method of curing a layer of dielectric material set forth in claim 3 wherein the substantially circular flood pattern comprises four areas of high intensity along the annular region near the outer periphery of the flood pattern, each of the four areas located at respective corners of a roughly square like pattern formed within the circular flood pattern.

5. The method of curing a layer of dielectric material set forth in claim 3 wherein the ultraviolet radiation is generated by first and second ultraviolet radiation lamps mounted facing each other at opposing angles relative to a vertical plane that intersects the substrate support.

6. The method of curing a layer of dielectric material set forth in claim 5 wherein each of the first and second ultraviolet radiation lamps are mounted at an angle of between 5-25 degrees relative to vertical plane.

7. The method of curing a layer of dielectric material set forth in claim 1 wherein exposing the step generates an irradiation pattern of ultraviolet radiation over the substrate, the irradiation pattern including a center region having a first intensity and an annular region surrounding the center region, the annular region including high intensity areas having a second intensity higher than the first intensity and low intensity areas having a third intensity lower than the first intensity.

8. The method of curing a layer of dielectric material set forth in claim 7 wherein the source of ultraviolet radiation is an elongated source of UV radiation and wherein the irradiation pattern of ultraviolet radiation is shaped by a pair primary reflectors partially surrounding the elongated source and a secondary reflector positioned between the primary reflector and the substrate support.

9. The method of curing a layer of dielectric material set forth in claim 8 wherein the primary reflectors are adapted to reflect ultraviolet radiation from the radiation source towards the substrate support and the secondary reflector is adapted to redirect ultraviolet radiation that would otherwise not contact the substrate towards the substrate the secondary reflector.

10. The method of curing a layer of dielectric material set forth in claim 8 wherein the primary reflectors and the secondary reflector combine to generate a substantially circular flood pattern or radiation.

11. The method of curing a layer of dielectric material set forth in claim 1 wherein the exposing step rotates the ultraviolet radiation source.

12. The method of curing a layer of dielectric material set forth in claim 1 wherein the exposing step generates a substantially circular flood pattern of radiation having high and low intensity areas along an annular region near an outer periphery of the flood pattern.

13. The method of curing a layer of dielectric material set forth in claim 12 wherein the substantially circular flood pattern of radiation further includes a central area within a first intensity range and wherein the radiation intensity within the high intensity area along the annular region is greater than the first intensity range and the radiation intensity within the low intensity area along the annular region is less than the first intensity range.

14. The method of curing a layer of dielectric material set forth in claim 13 wherein during the exposing step the high and low intensity areas combine to a value within the first intensity range.

15. The method of curing a layer of dielectric material set forth in claim 14 wherein the irradiation pattern of ultraviolet radiation is shaped by a first reflector that partially surrounds the source of ultraviolet radiation and a second reflector positioned between the first reflector and the substrate support.

\* \* \* \* \*